United States Patent [19]
Akita

[11] Patent Number: 6,154,402
[45] Date of Patent: Nov. 28, 2000

[54] SEMICONDUCTOR MEMORY DEVICE

[75] Inventor: Hironobu Akita, Yokohama, Japan

[73] Assignee: Kabushiki Kaisha Toshiba, Kawasaki, Japan

[21] Appl. No.: 09/398,201

[22] Filed: Sep. 17, 1999

[30] Foreign Application Priority Data

Sep. 7, 1998 [JP] Japan ................................. 11-253212
Oct. 19, 1998 [JP] Japan ................................. 10-297027

[51] Int. Cl.$^7$ ................................................ G11C 7/00
[52] U.S. Cl. ........................................ 365/203; 365/207
[58] Field of Search ................................ 365/149, 203, 365/205, 207

[56] References Cited

U.S. PATENT DOCUMENTS

| | | | |
|---|---|---|---|
| 5,469,395 | 11/1995 | Kuwabara et al. | 365/203 |
| 5,689,461 | 11/1997 | Kaneko et al. | 365/203 |
| 5,703,814 | 12/1997 | Nishimura et al. | 365/203 |
| 5,995,431 | 11/1999 | Inui et al. | 365/203 |
| 6,031,779 | 2/2000 | Takahashi et al. | 365/203 |

*Primary Examiner*—Son T. Dinh
*Attorney, Agent, or Firm*—Banner & Witcoff, Ltd.

[57] ABSTRACT

In a semiconductor memory device, charge transfer gates and a bit line precharging/equalizing circuit are inserted in the order mentioned in a bit line pair between memory cells and a sense amplifier. When the transfer gates are off, data of the memory cells are read out to the bit line pair located on the memory cell side. Subsequently, when the transfer gates are turned on, the data are transferred to the bit line pair located on the sense amplifier side. Thereafter, the transfer gates are turned off on the basis of a threshold value of the transfer gates. Then, the memory cell data transferred to the sense amplifier side are amplified by a conventional DRAM method. The bit line precharging/equalizing circuit does not require a large area. It is therefore possible to miniaturize the semiconductor memory device.

66 Claims, 16 Drawing Sheets

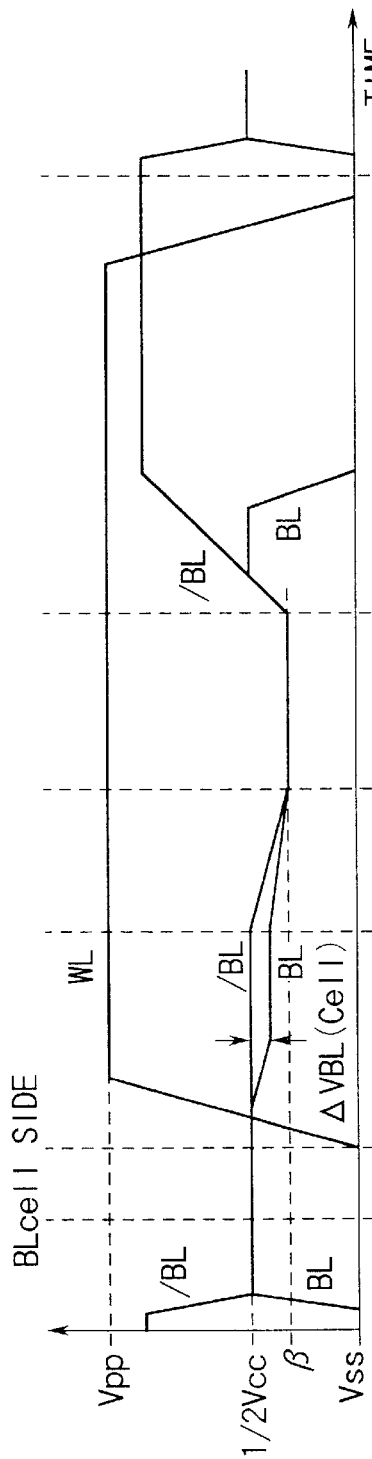
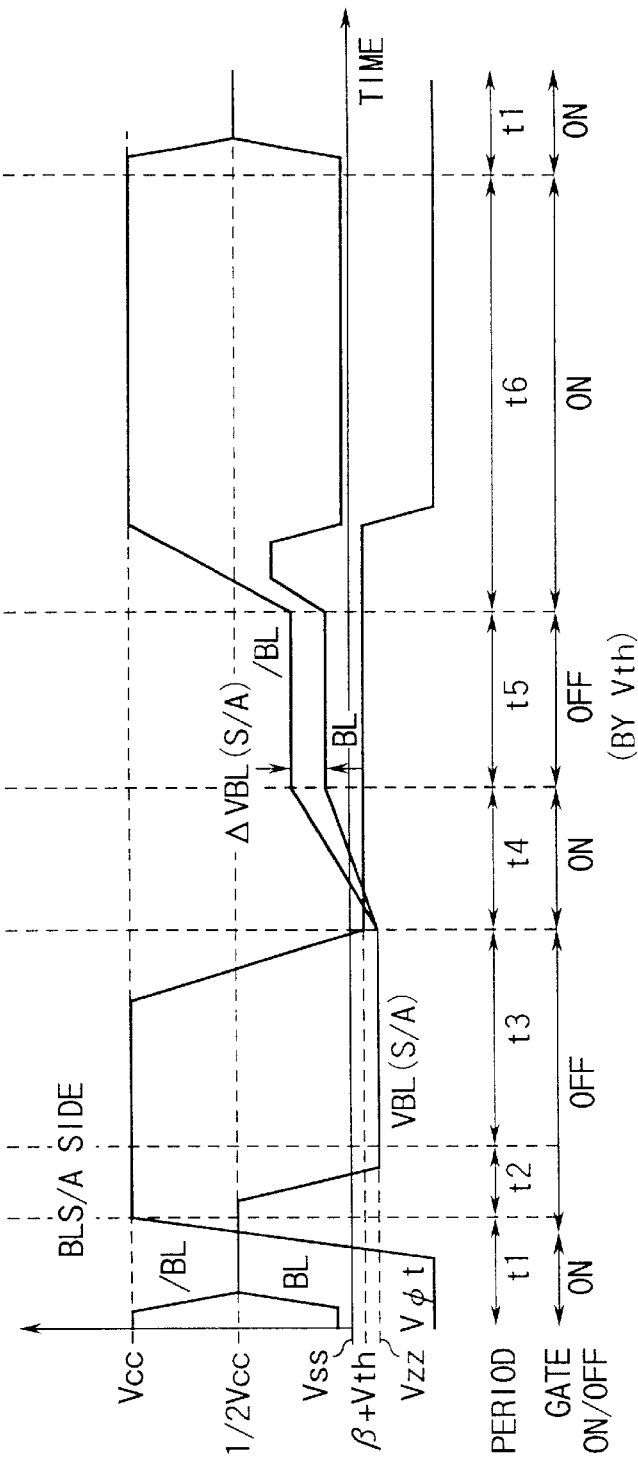
FIG. 9A
FIG. 9B
FIG. 9C

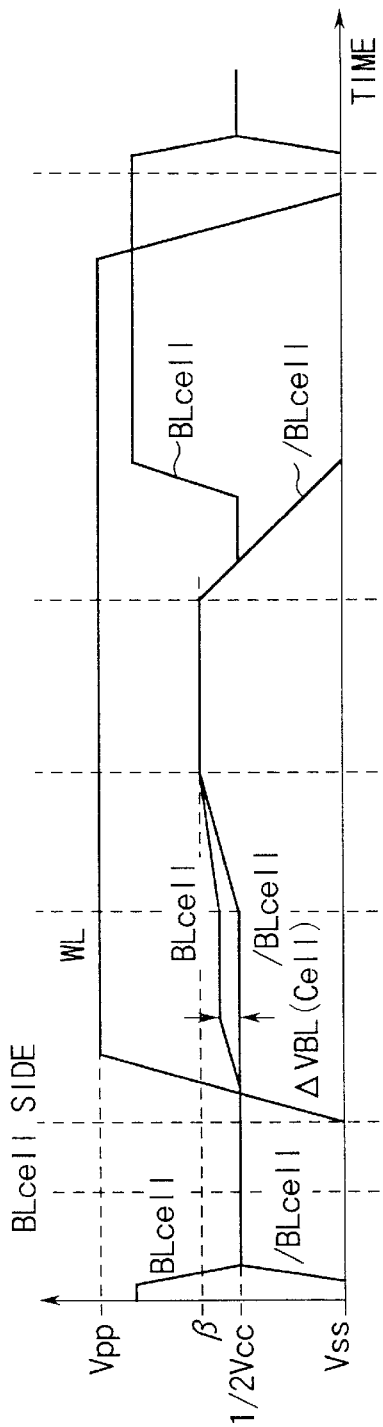
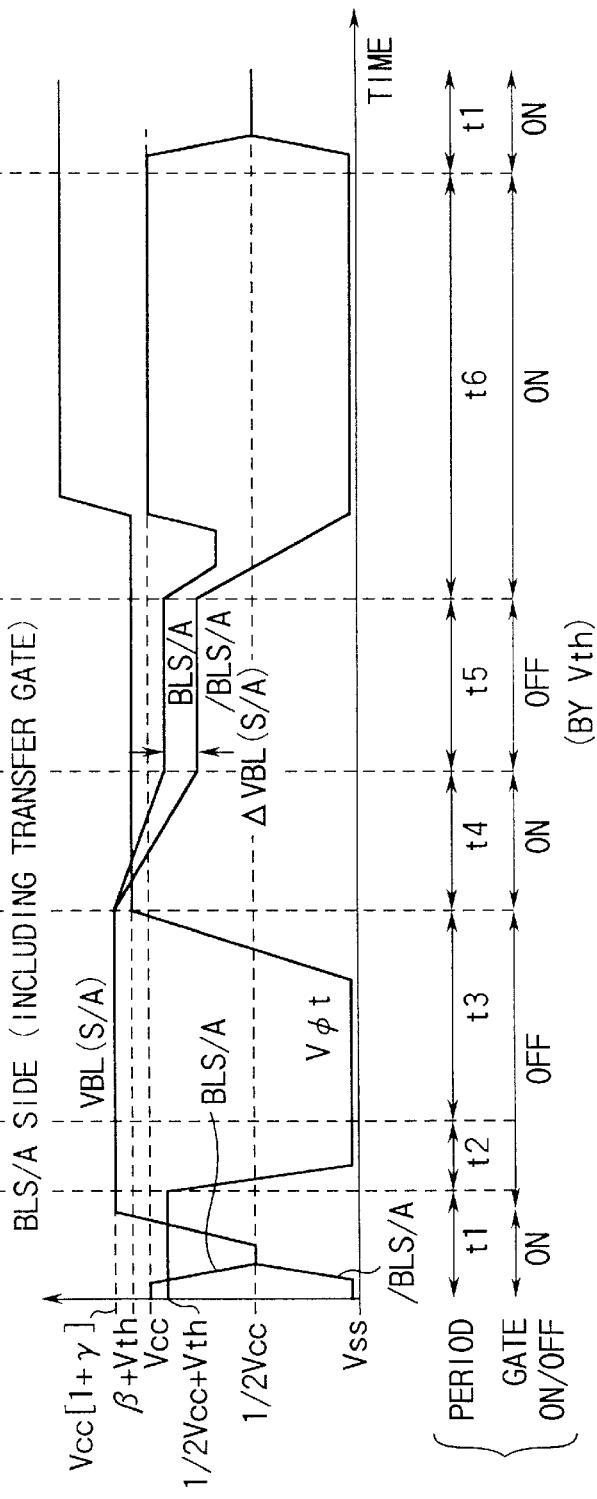
FIG. 10A
FIG. 10B
FIG. 10C

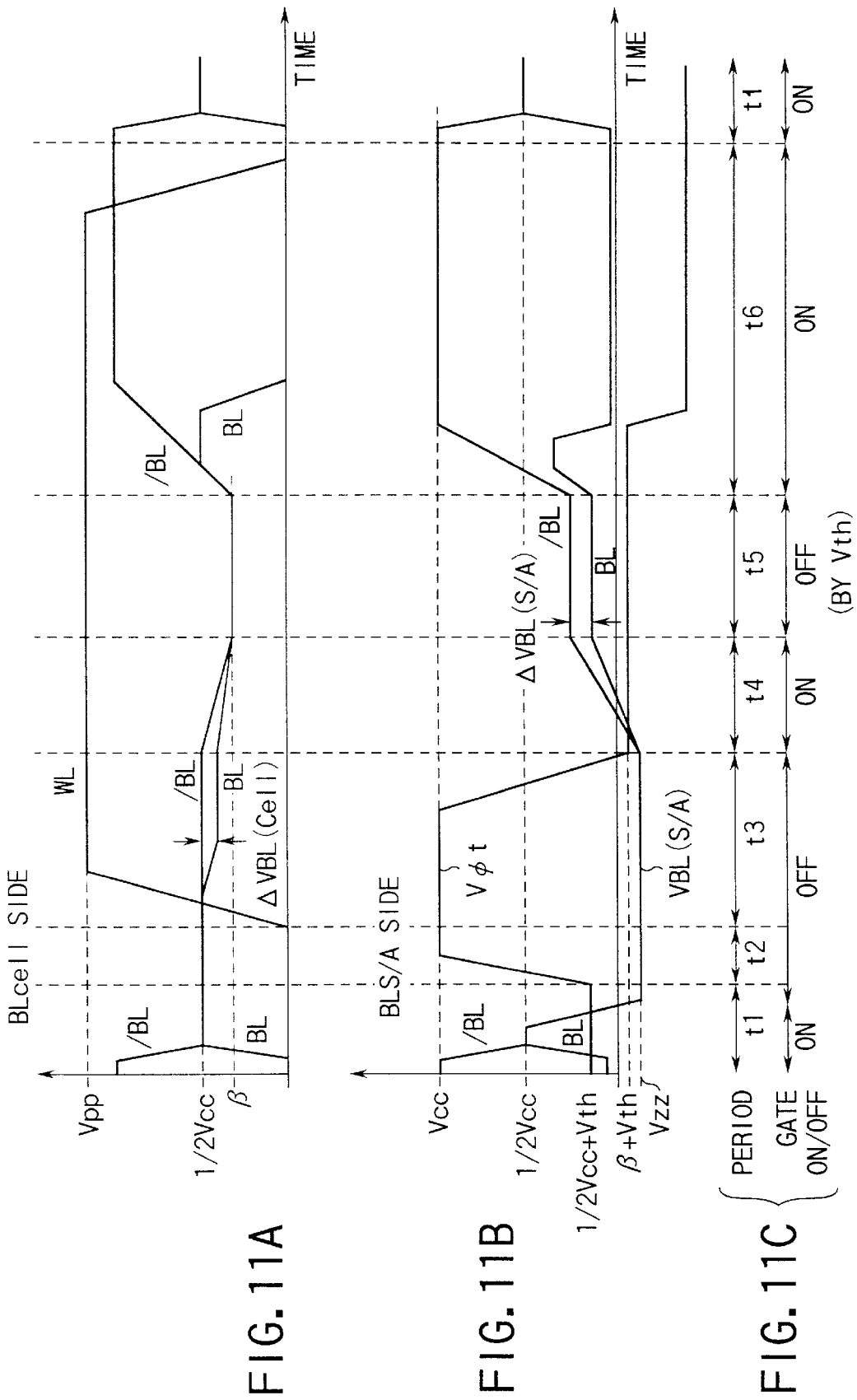

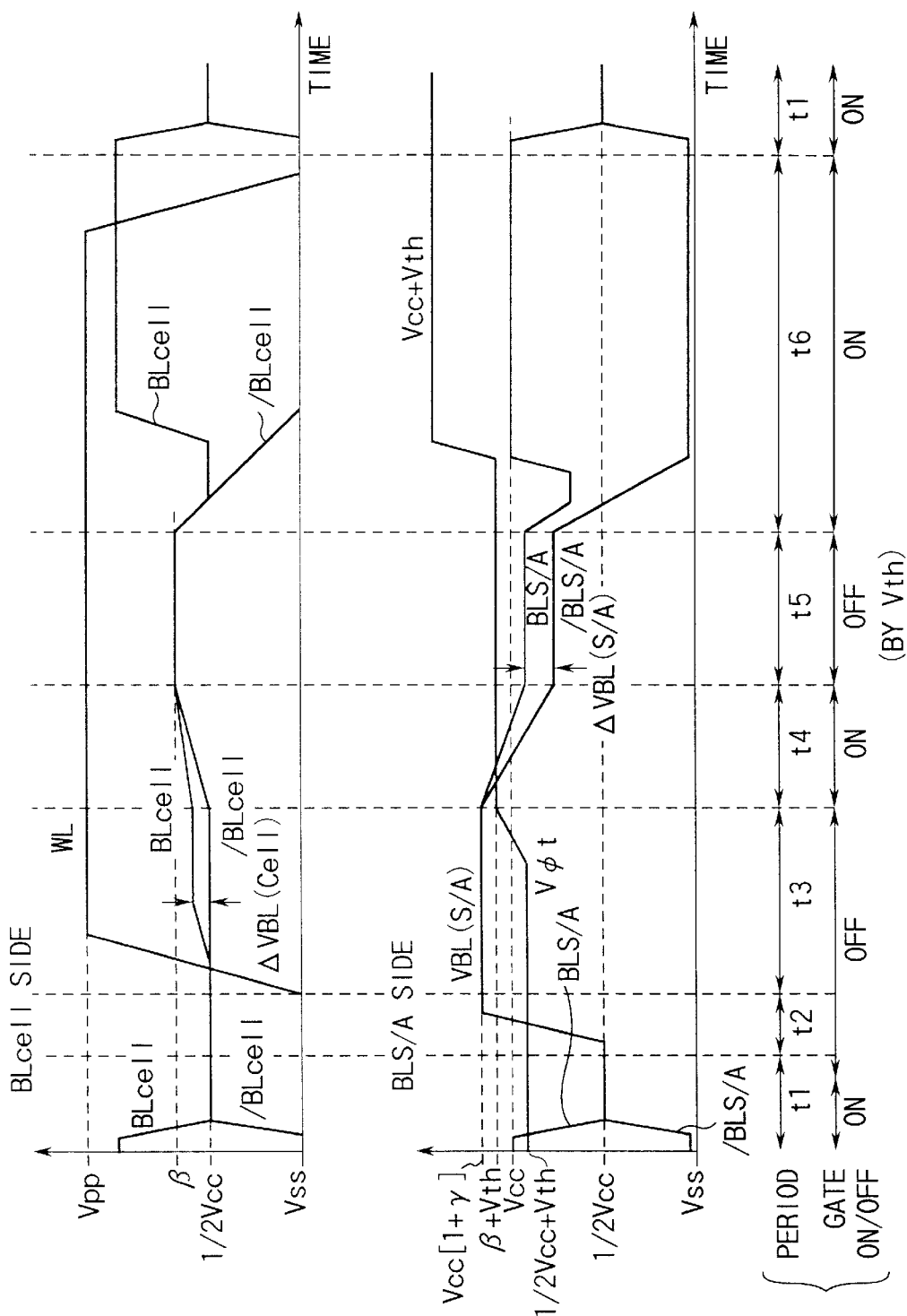

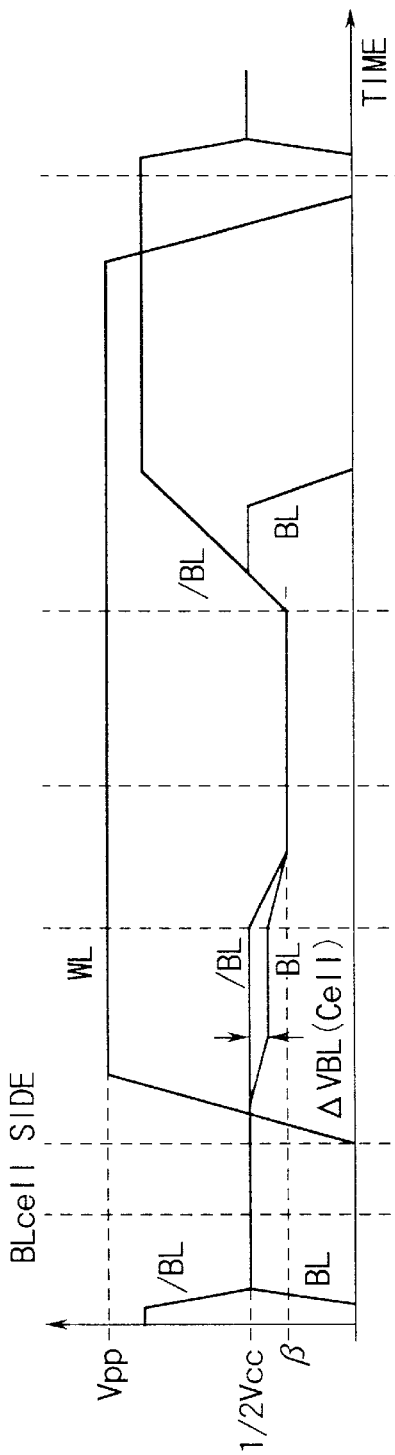
FIG. 19A
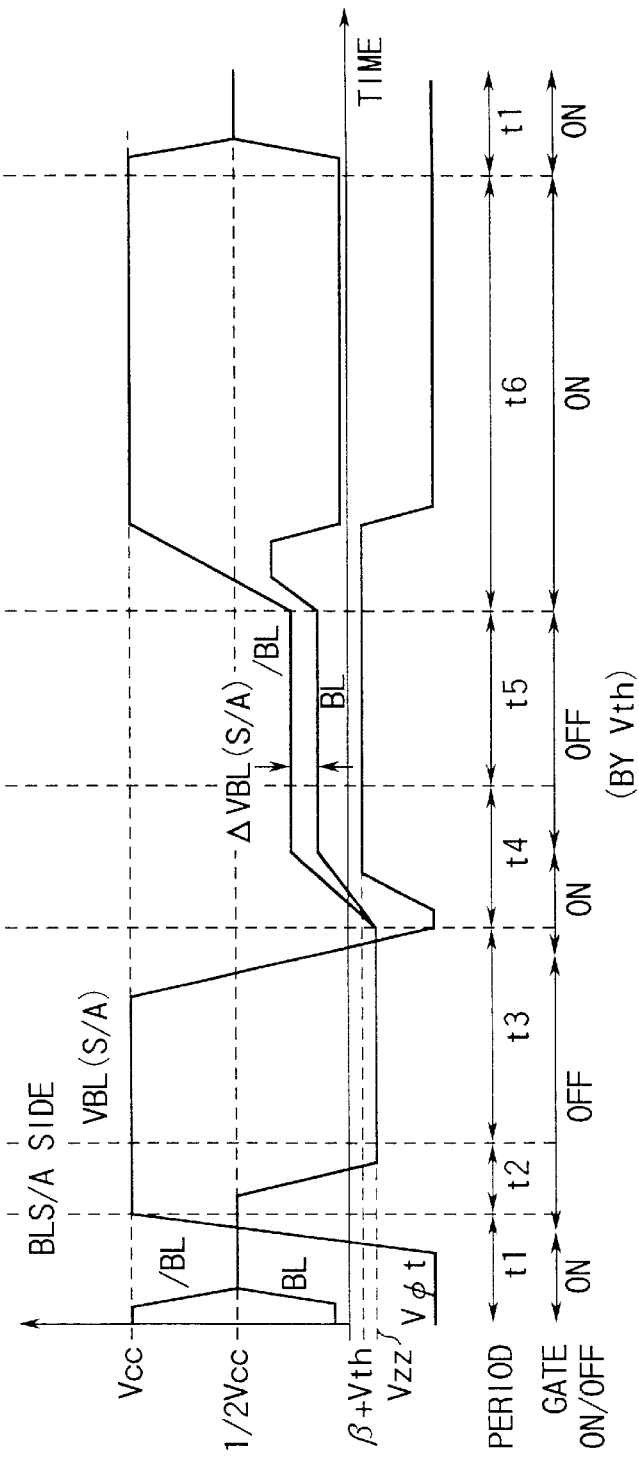
FIG. 19B
FIG. 19C

SEMICONDUCTOR MEMORY DEVICE

BACKGROUND OF THE INVENTION

The present invention relates to a dynamic semiconductor memory device to which a power supply voltage of e.g., 1V or less can be applied, and more particularly, to a sense system of the dynamic semiconductor memory device.

In a dynamic random access memory device (DRAM), as miniaturization of the device is accelerated, an amount of charge accumulated in a cell capacitor is reduced. Since the charge accumulated in the cell capacitor is released during a read-out operation in the DRAM, the reduction of capacitance in the cell capacitor has a direct effect upon charge storage characteristics, in particular, holding time in the DRAM. Besides this, with a recent tendency of lowering the power supply voltage, the amount of charge accumulated in the cell capacitor has been reduced. Therefore, the holding time will be further reduced.

The read-out operation in the DRAM is performed by releasing the charge of a memory cell to a bit line and detecting a slight potential change of the bit line by a sense amplifier. In the read out operation, the change in potential of the sense amplifier right after the charge of the memory cell is released is smaller than the voltage virtually written in the memory cell. A potential change in the sense amplifier section after a word line is activated and charge of the cell is released to a bit line, is expressed by Equation (1):

$$Vsense = (Vcell - VBL) \times Cs/(Cb+Cs) \quad (1)$$

where Vsense is an amount of a signal voltage output to a bit line, Vcell is a potential of a storage node right before a word line is activated, VBL is a precharge potential of a bit line, Cs is a cell capacitance, and Cb is a capacitance of a bit line.

Cb is about 20 times as large as Cs. Vsense decreases up to about 1/20 of cell write voltage Vcell−VBL. If the Vsense is reduced equal to and less than the read-out sensitivity of the sense amplifier, incorrect data comes to be read out. To prevent this, it is required to increase a voltage to be applied in order to release charge of a memory cell to a bit line. As such a technique, a charge transfer type sense amplifier has been developed.

Now, the charge transfer type sense amplifier will be explained.

FIG. 1 shows a schematic circuit diagram of a charge transfer type sense amplifier. The memory cell MC is constituted of a transistor Q3 and a capacitor C1. The gate of the transistor Q3 is connected to a word line WL. An end of the current path of the transistor Q3 is connected to a bit line BL. A transistor Q2 is inserted in the bit line BL. A voltage VR is supplied to the gate of the transistor Q2. An end of the current path of a transistor Q1 is connected to a bit line BLS/A, which is interposed between the transistor Q2 and a sense amplifier (not shown). A voltage VH is supplied to the other end of the current path of a transistor Q1. A capacitor Cb is a parasitic capacitor of a bit line BL cell located on a memory cell side of the transistor Q2. A capacitor Cs a is a parasitic capacitor of a bit line BLS/A located on a sense amplifier side of the transistor Q2. The transistor Q2 is a charge transfer gate.

In this circuit arrangement, when a signal φ1 to be supplied to the gate of the transistor Q1 goes to a high level during a bit line precharge period, as shown in FIG. 2, the transistor Q1 is turned on, whereby the bit line BLS/A on the sense amplifier side is charged to a voltage VH by way of the transistor Q1. At this time, since the gate of the transistor Q2 is set at a voltage VR (<VH), if the bit line BLcell on the memory cell side is charged up to VR-Vth, the transistor Q2 is turned off. The Vth used herein is a threshold voltage of the transistor Q2. When the charge operation is completed and thereafter the word line WL is activated, the potential of the bit line BL varies depending upon the amount of charge accumulated in the storage node of the capacitor C1. More specifically, in the case where the memory cell MC stores data "0" (ground potential Vss), the potential of the bit line BL cell decreases lower than the voltage VR-Vth. As a result, the transistor Q2 is turned on.

After the transistor Q2 is turned on, the potential of the bit line BLS/A on the sense amplifier side changes as indicated by Equation (2):

$$\Delta VBLS/A = \Delta VBLcell \times Cb/Csa \quad (2)$$

where $\Delta V$ BLS/A is a potential change of the bit line BLS/A, $\Delta V$ BLcell is a potential change of the bit line BLcell, Cb is a capacitance of a bit line BLcell, and Csa is a capacitance of a bit line BLS/A.

Cb is about 20 times as large as Csa. Therefore, if $\Delta$VBLcell has a voltage of, e.g., −0.02V, $\Delta$VBLS/A is amplified up to about −0.4V. However, if the memory cell MC stores data "1", the transistor Q2 remains in an OFF state and VBLS/A remains at "1", since $\Delta$VBLcell is not negative. To sense "1", a dummy cell is additionally required.

When the charge transfer type sense amplifier is used, it is impossible to use half of the power source voltage Vcc (½ Vcc) as a precharge voltage to be applied to the bit line, although ½ Vcc is preferable since power consumption is reduced. In addition, the dummy cell is required.

FIG. 3 shows a circuit arrangement of a conventional charge transfer type sense amplifier to which ½ Vcc can be applied as the precharge voltage for the bit line (Masaki Tsukude et al., "A 1.2V to 3.3V Wide-Range DRAM with 0.8V Array Operation", IEEE International Solid-State Circuit Conference Digest of Technical Papers, pp 66–67, 1997).

In FIG. 3, a selection gate SG1 (serving as a charge transfer gate) is inserted in the midway of each extension line of a bit line pair BL, /BL. To one side (upper side of the figure) of the selection gate SG1, not only an equalizing circuit EQL for equalizing the bit line pair but also a first sense amplifier p-SA formed of p-channel transistors are connected. To the other side (lower side of the figure) of the selection gate SG1, not only a precharge circuit PRC for precharging the bit line pair but also a second sense amplifier n-SA formed of N-channel transistors, are connected.

In the aforementioned circuit arrangement, the precharge circuit PRC is activated during the precharge period, whereby the bit line pair on the side of the second sense amplifier n-SA are charged up to a sense amplifier precharge level Vcc[1+γ] (e.g., 1.6V) and the bit line pair on the bit line side are precharged to ½ Vcc (e.g., 0.4V). After the word line WL is activated, the gate voltage SGL of the selection gate SG is increased from a ground potential Vss to β+Vth. For example, if β+Vth is increased to 0.9V, (β: 0.5V, Vth: 0.4V, for example), the charges of the bit line on the side of the second sense amplifier n-SA are transferred to the bit line on the side of the first sense amplifier p-SA. As a result, both bit lines BL, /BL are charged to a potential of SGL-Vth=β(for example, 0.5V). More specifically, the bit lines BL, /BL to which the memory cell MCs are connected, are charged at the same potential by the transfer of charges from the side of the second sense amplifier n-SA. In this way, the circuit of the charge transfer type sense amplifier functions.

In the meantime, to obtain a maximum potential difference in the sense amplifier, a value of β is larger than the potential when data 1 is read out to a bit line and is a potential inevitably supplied by transferring charges from a sense amplifier side during the data "0". More specifically, the value of β must satisfy the relationship expressed by Equation (3):

$$\frac{1}{2}Vcc \times [1+Cs/(Cb+Cs)] < \beta < (Vcc[1+\gamma] \times Csa + \frac{1}{2}Vcc \times Cb)/(Cb+Csa+Cs) \quad (3)$$

where Cs is a capacitance of a memory cell, Cb is a capacitance of a bit line on the memory cell side, and Csa is a capacitance of a bit line on a sense amplifier side.

Furthermore, it is necessary to add 0.05V to a right hand side of the equation as an operational margin. For example, assuming that Cb=20×Cs, Csa=Cs, Vcc[1+γ]=1.6V, ½ Vcc= 0.4V, β is controlled to satisfy the following equation: 0.42V<β<0.44V.

The charge transfer type sense amplifier shown in FIG. 3 employs ½ Vcc as the bit line precharge voltage. However, in this circuit, the precharge circuit PRC for the sense amplifier and the equalizing circuit EQL for the bit line must be arranged at both sides of the selection gate $SG_1$ (charge transfer gate), respectively. Furthermore, it is impossible to share a p-channel type sense amplifier between a memory cell (not shown) connected to one of sides (the lower portion of FIG. 3) of a selection gate $SG_2$ and a memory cell connected to a selection gate $SG_1$. For these reasons, the scale of the circuit is enlarged, so that a chip size and a manufacturing cost are increased.

BRIEF SUMMARY OF THE INVENTION

An object of the present invention is to provide a semiconductor memory device having a charge transfer type sense amplifier for charging a bit line at ½ voltage of a power supply voltage without increasing a circuit scale.

To obtain the aforementioned object, the semi-conductor memory device according to a first aspect of the present invention comprises a bit line pair including two complementary bit lines to each of which a memory cell is connected;

a sense amplifier connected to the bit line pair, amplifying a potential difference of the bit line pair;

charge transfer gates each inserted in and connected to a corresponding one of the two complementary bit lines of the bit line pair located between the memory cell and the sense amplifier, the charge transfer gates each having a control terminal controlling ON/OFF thereof;

a gate potential generator connected to the charge control terminal, controlling ON/OFF of each of the charge transfer gates;

a precharging/equalizing circuit connected to the bit line pair located on a sense amplifier side of the charge transfer gate; and a bit line potential generator connected to the precharging/equalizing circuit, generating a potential precharging and equalizing the bit line pair.

The semiconductor memory device according to a second aspect of the present invention comprises a bit line pair including two complementary bit lines to each of which a memory cell is connected;

a sense amplifier connected to the bit line pair, amplifying a potential difference of the bit line pair;

charge transfer gates each inserted in and connected to a corresponding one of the two complementary bit lines of the bit line pair located between the memory cell and the sense amplifier, the charge transfer gates each having a control terminal controlling ON/OFF thereof;

a gate potential generator connected to the control terminal, controlling ON/OFF of each of the charge transfer gates;

a precharging circuit connected to the bit line pair of a sense amplifier side of the charge transfer gates, precharging the bit line pair;

a first signal line connected to the precharging circuit, transmitting a precharge startup signal;

an equalizing circuit connected to the bit line pair located on the sense amplifier side of the charge transfer gates, equalizing the bit line pair;

a second signal line connected to the equalizing circuit, transmitting an equalizing startup signal; and a bit line potential generator connected to the precharge circuit, generating a potential precharging the bit line pair.

The semiconductor memory devices according to the first and second aspects are preferably constituted as described below.

The gate potential generator generates a potential of ½ Vcc+Vth or more (Vcc is a power supply voltage, and Vth is a threshold voltage of the charge transfer gates) during a bit line precharging/equalizing period, and the bit line potential generator generates a potential of ½ Vcc at the same time.

The gate potential generator generates a potential of ½ Vcc+Vth or more (Vcc is a power supply voltage and Vth is a threshold voltage of the charge transfer gates) during a bit line precharging/equalizing period, and the bit line potential generator generates a potential of ½ Vcc or more after completion of equalization.

The gate potential generator continuously activates the charge transfer gates until a potential of the memory cell is read out to a corresponding one of the bit lines to which the sense amplifier is connected.

The gate potential generator supplies a potential to the control terminal of each of the charge transfer gates, the potential being higher than a value in a case where each of the charge transfer gates is an n-channel MIS transistor and lower in a case where each of the charge transfer gates is a p-channel MIS transistor, the value being obtained by adding a threshold voltage of the charge transfer gates to a potential which is to be transferred to a corresponding one of the two complementary bit lines on the sense amplifier side, after a potential of the memory cell is output to the corresponding one of the two complementary bit lines on a memory cell side, so that a potential of a corresponding one of the two complementary bit lines located on the memory cell side is transferred to the sense amplifier.

The potential transferred to the bit line on the sense amplifier side is a highest one of potentials to be supplied by the gate potential generator in order to turn on the charge transfer gates in a case where each of the charge transfer gates is an n-channel MIS transistor, and a lowest one of the potentials in a case where each of the charge transfer gates is a p-channel MIS transistor.

The gate potential generator outputs at least three levels of potentials.

The gate potential generator outputs four levels of potentials and the bit line potential generator outputs a single potential.

Each of the charge transfer gates is not activated until a potential of the memory cell is output to a corresponding one of the two complementary bit lines, to which the memory cell is connected.

Each of the charge transfer gates is not activated by a threshold voltage thereof, after a potential of the memory cell is transferred to a corresponding one of the two complementary bit lines, to which the sense amplifier is connected.

As described above, the conventional charge transfer type sense amplifier shown in FIG. 3 has an equalizing circuit consisting of three transistors between a memory cell and a p-type sense amplifier and a precharging circuit consisting of two transistors between a selection gate and an n-type sense amplifier. In contrast, in the present invention, a precharging/equalizing circuit consisting of three transistors between the selection gate and the sense amplifier. Hence, the circuit scale can be reduced compared to the conventional one.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a timing chart of the circuit at a BL cell side (memory cell side); FIG. 6B is a timing chart of the circuit at a BLS/A side (sense amplifier side); and FIG. 6C is designation of time periods and an ON-OFF state of the transfer gate;

FIGS. 9A–9C are timing charts for explaining how to operate the circuit shown in FIG. 7;

FIGS. 10A–10C are timing charts of the semiconductor memory device using the charge transfer type sense amplifier according to a second embodiment of the present invention;

FIGS. 11A–11C are timing charts of a modified example of the second embodiment in which a transfer gate is formed of a p-channel MIS transistor;

FIGS. 14A–14C are timing charts for explaining how to operate a semiconductor memory device according to a fourth embodiment of the present invention, when data "1" is stored in a memory cell;

FIG. 19A–19C are timing charts for explaining how to operate a semiconductor memory device according to the fifth embodiment of the present invention, in which the transfer gate formed of a p-channel MIS transistor is used.

DETAILED DESCRIPTION OF THE INVENTION

Figure 4:
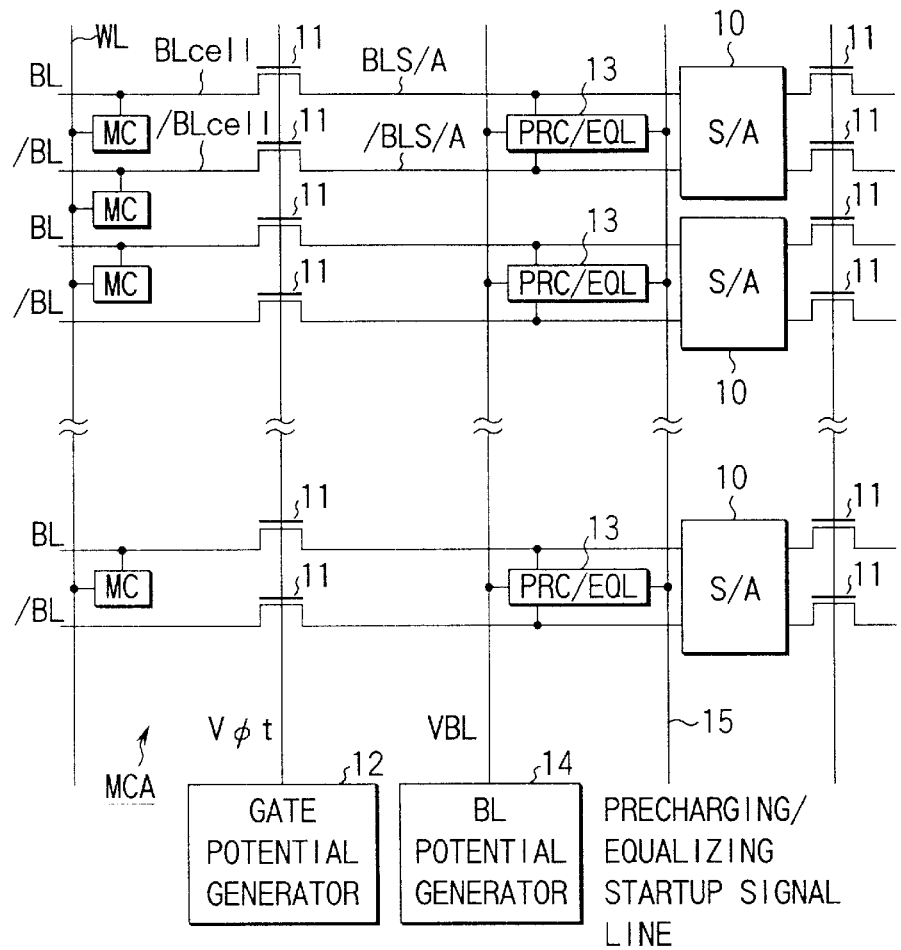
FIG. 4 is a circuit arrangement showing a semiconductor memory using the charge transfer type sense amplifier according to a first embodiment of the present invention.

Now, embodiments of the present invention will be described with reference to the accompanying drawings.
First Embodiment FIG. 4 shows a circuit arrangement of a sense amplifier of a semiconductor memory device of the present invention.

Figure 1:
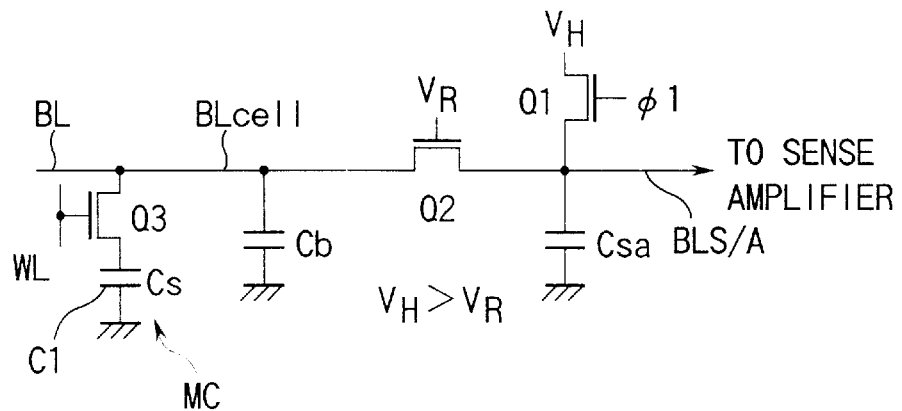
FIG. 1 is a schematic circuit diagram showing a charge transfer gate portion of a conventional charge transfer type sense amplifier.
Figure 2:
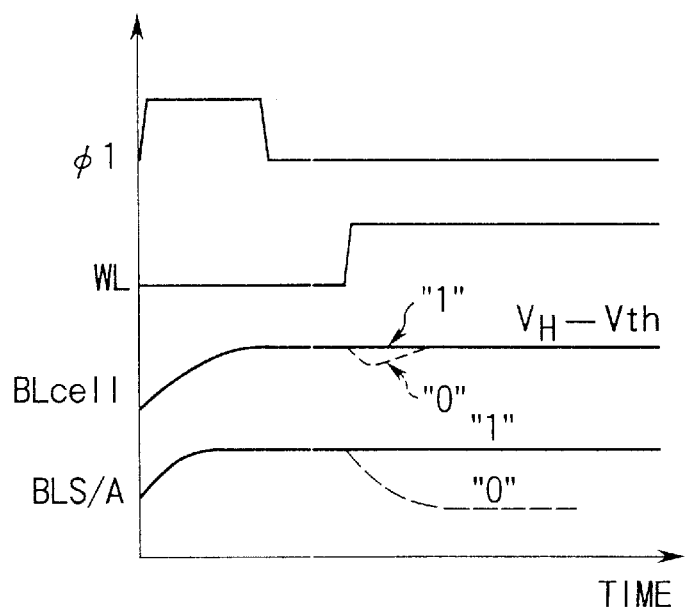
FIG. 2 is a timing chart for explaining how to operate the circuit of FIG. 1.
Figure 3:
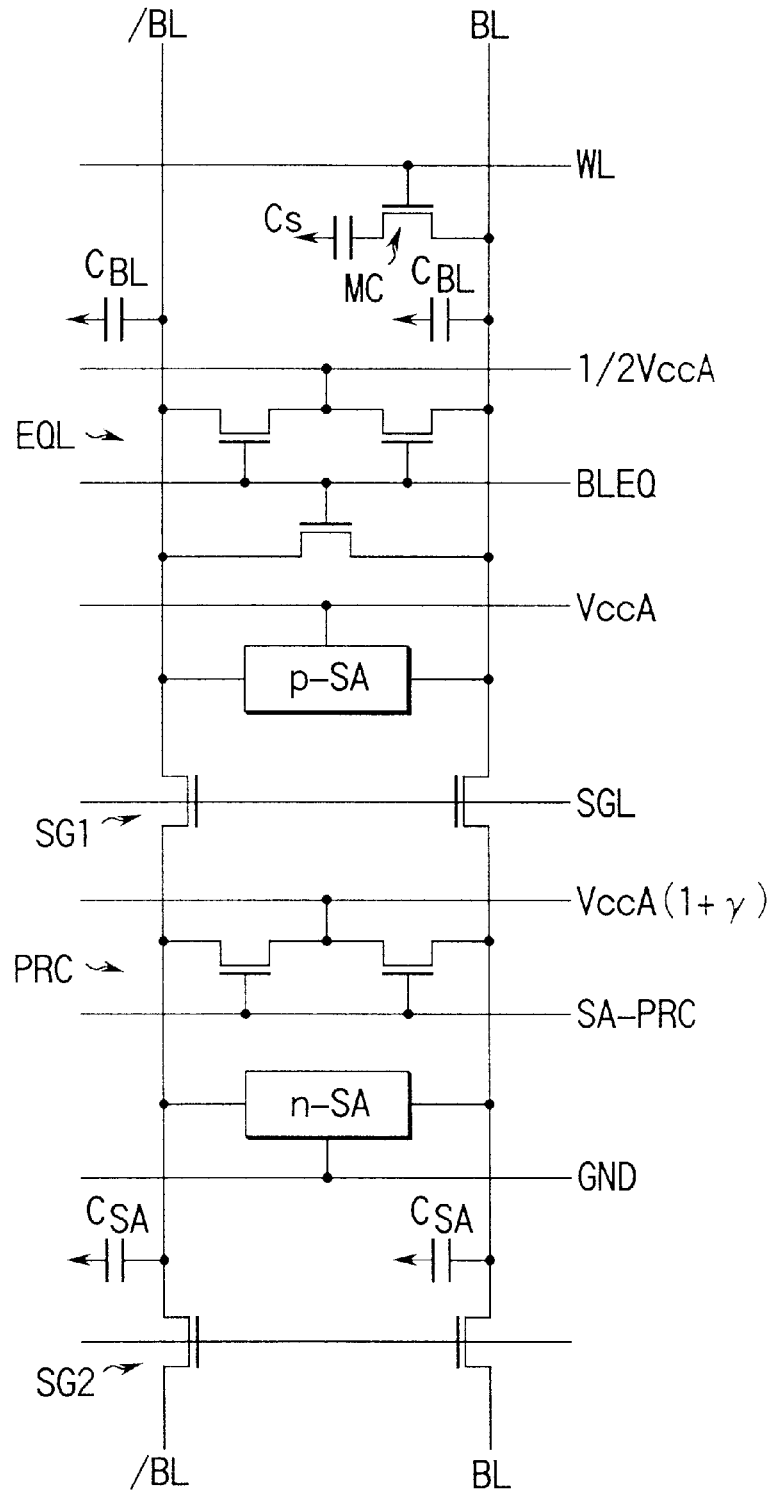
FIG. 3 is a circuit diagram showing another example of the conventional charge transfer type sense amplifier.

In a memory cell array MCA, a plurality of memory cells MC are arranged in a matrix form. Each memory cell MC is constituted of a cell transistor and a capacitor in the same manner as in FIG. 3. A gate of each transistor is connected to a word line WL. An end of a current path of each cell transistor is connected to a bit line BL, or /BL. Each of the bit lines BL, /BL is independently connected to a sense amplifier S/A 10.

Furthermore, to each of the bit lines BL, /BL, a charge transfer gate 11 formed of an N channel MIS transistor is connected. To each gate of the charge transfer gates 11, an output end of a gate potential generator 12 is connected. The gate potential generator 12 generates a potential V$\phi$t for starting up the charge transfer gate 11.

Furthermore, each line of the bit line pair BL, /BL is divided into a bit line on a cell side, BLcell, /BL cell and a bit line on the sense amplifier side, BLS/A, /BLS/A. To each line of the bit line pair BLS/A, /BLS/A, a precharging/equalizing circuit (PRC/EQL) 13 is connected for precharging and equalizing the bit lines. To each precharging/equalizing circuit 13, not only an output end of a bit line potential generator 14 but also a precharging/equalizing startup signal line 15 is connected.

The bit line potential generator 14 generates a ½ voltage of a power source voltage Vcc, that is ½ Vcc (e.g., 0.4V). As the power source voltage Vcc, a voltage obtained by reducing the power source voltage within the chip, may be used.

Furthermore, since this circuit is formed in accordance with a shared sense amplifier method, another bit line pair BL, /BL and another memory cell MC (not shown) are connected to each sense amplifier 10 at a right side thereof via the charge transfer gate 11. In this manner, the sense amplifier 10 and the precharging/equalizing circuit 13 are shared with the bit line pairs arranged on both sides of the sense amplifier 10.

Figure 5:
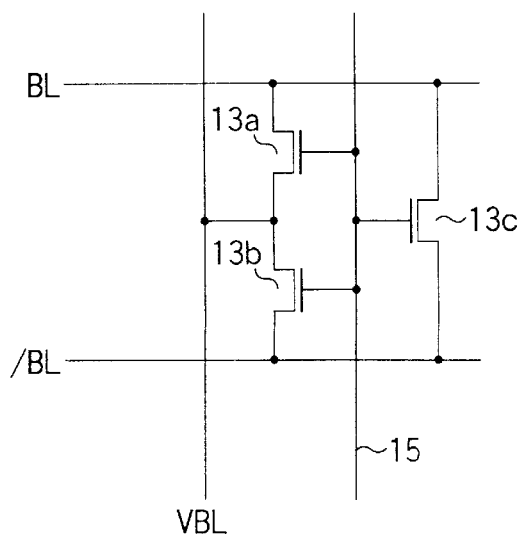
FIG. 5 is a circuit diagram of a precharging/equalizing circuit (PRC/EQL) of FIG. 4.

FIG. 5 shows a circuit diagram of the precharging/equalizing circuit 13. The precharging/equalizing circuit 13 is constituted of N channel transistors 13a, 13b, and 13c. Current paths of the transistors 13a, 13b are connected in series between the bit line pair BL, /BL. A current path of the transistor 13c is connected between the bit line pair BL, /BL. To the gate of each of the transistors 13a, 13b and 13c, the precharging/equalizing startup signal line 15 is connected. To a node of current paths of the transistors 13a and 13b, a bit line potential VBL output from the bit line potential generator 14 is supplied.

Figure 6:
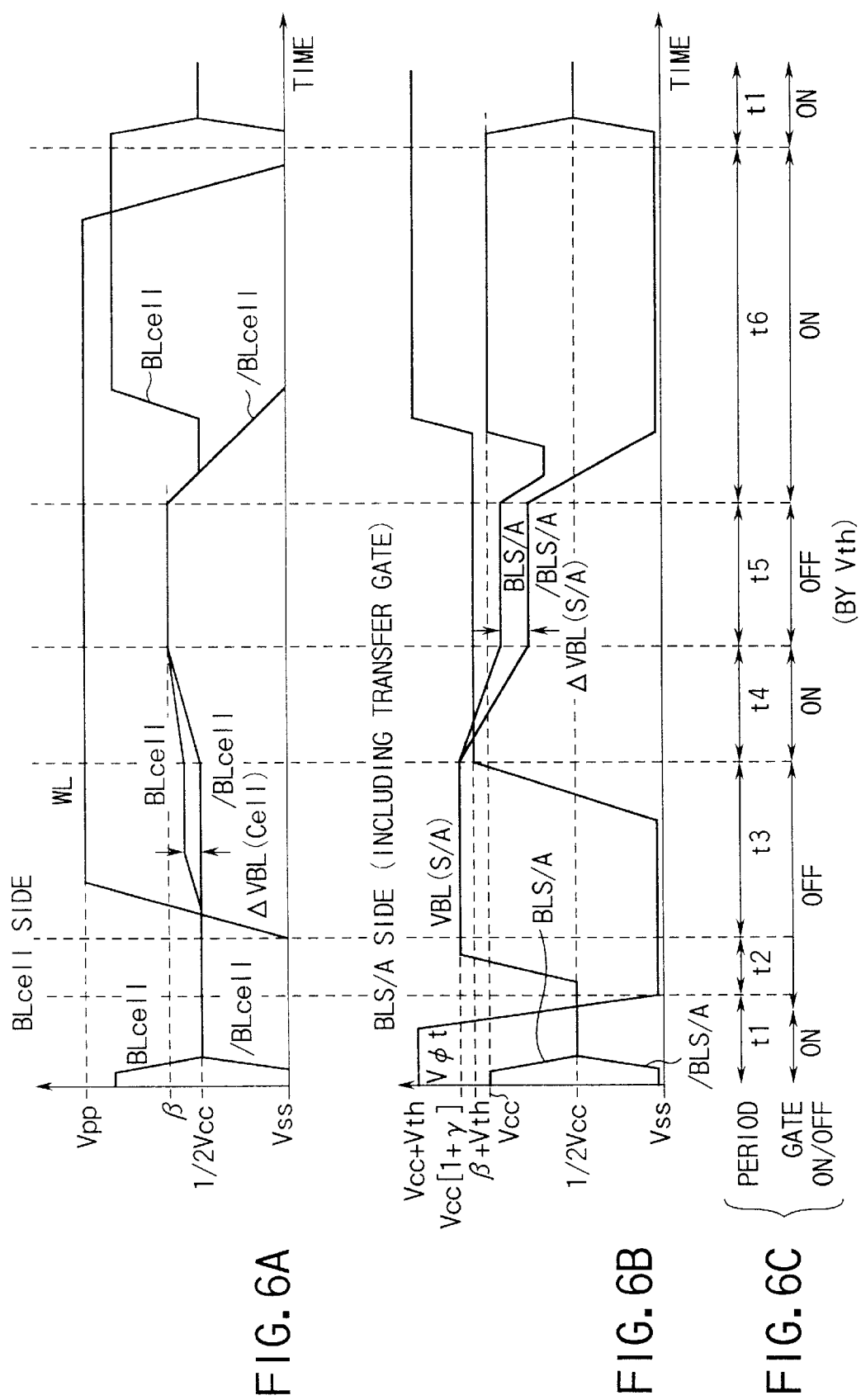
FIGS. 6A–6C are timing charts for explaining how to operate the circuit shown in FIG. 4.

Now, how to operate the circuit thus arranged will be explained with reference to FIGS. 6A–6C. FIG. 6A shows how to change the potential of the bit line pair BLcell, /BLcell on the memory cell side. FIG. 6B shows how to change the potential of the bit line pair BLS/A, /BLS/A on the sense amplifier side. Both potential changes are plotted on the same time axis. FIG. 6C shows designation of time periods on the same time axis and an on-off state of the transfer gate 11 for each time period. The same type drawings (described later) have the same arrangement, so that duplicate explanation will be omitted. Next, operations in individual periods will be explained.

Period t1

In Period t1, a potential ½ Vcc is output from the bit line potential generator 14 and supplied to each precharging/equalizing circuit 13. Therefore, the bit line pair BLS/A, /BLS/A on the sense amplifier side are precharged and equalized by the precharging/equalizing circuit 13 to the potential ½ Vcc. At this time, a potential Vφt is output from the gate potential generator 12 at a high level (Vcc+Vth, in this embodiment), with the result that the charge transfer gate 11 is turned on. Thus, the potential of the bit line pair BLS/A, /BLS/A on the sense amplifier side is transferred to the bit line pair BLcell, /BLcell on the cell side by way of the charge transfer gate 11. The potential Vφt may be equal to or more than ½ Vcc+Vth (Vth corresponds to a threshold voltage of the N channel transistor, e.g., 0.4V), preferably 0.8V or more, and more preferably, 1.6V. The potential of the bit line pair BLS/A, /BLS/A is transferred to the bit line pair BL cell, /BL cell via the charge transfer gate 11. After the bit line pair BL cell, /BL cell is equalized and precharged, the potential Vφt is changed to a low level by the gate potential generating circuit 12 to thereby turn off the charge transfer gate 11.

Period t2

In the Period t2, a potential VBL=Vcc [1+γ] (e.g., 1.6V) is generated by the bit line potential generator 14. The bit line pair BLS/A, /BLS/A are then precharged to a potential Vcc[1+γ] by the precharging/equalizing circuit 13 in accordance with the potential VBL. The potential Vcc [1+γ] satisfies the following equation (3) (explained in THE BACKGROUND OF THE INVENTION) which shows the relationship between the potential Vcc [1+γ] and a voltage β of the bit line pair BLcell, /BLcell in period t5 (described later).

$$\frac{1}{2}Vcc \times [1+Cs/(Cb+Cs)] < \beta < (Vcc[1+\gamma] \times Csa + \frac{1}{2}Vcc \times Cb)/(Cb+Csa+Cs) \quad (3)$$

Where Cs is a capacitance of a memory cell, Cb is a capacitance of a bit line on the memory cell side, and Csa is a capacitance of the bit line on the sense amplifier side.

In this embodiment, as a requisite margin, for example, 0.05V may be added on the right hand side of the equation, too.

Period t3

In Period t3, the word line WL is activated and charge of the memory cell is transferred to the bit line pair BLcell, /BLcell. For example, if a potential Vcc (for example 0.8V) corresponding to data "1" is stored in a memory cell of the bit line BLcell, the potential of the bit line BLcell increases, whereas the potential of the bit line /BLcell is not changed, as shown in FIG. 6A. As a result, a potential difference ΔVBLcell is produced between the potential of the bit line BLcell and that of the bit line /BLcell. For example, assuming that the relationship between the capacitance Cb of the bit line BLcell and a capacitance of the cell Cs is expressed by Cb=20×Cs, the potential difference ΔVBLcell will become 0.02V. At this point, the potential ΔVφt is 0, that is, the charge transfer gate 11 is turned off. Thus, the potential of the bit line pair BLS/A is not changed.

Period t4

In Period t4, β+Vth (e.g., 0.9V) is generated as a potential Vφt, by the gate potential generator 12 to turn on the charge transfer gate 11. Consequently, charge is transferred from the bit line pair BLS/A, /BLS/A to the bit line pair BLcell, /BLcell via the charge transfer gate 11. Then, the potential of the bit line pair BLcell, /BLcell increases, whereas that of the bit line pair BLS/A, /BLS/A decreases.

Period t5

In Period t5, a potential of the bit line pair BLcell, /BLcell increases to Vφt−Vth=β, for example, 0.5V. Then, the charge transfer gate 11 is turned off on the basis of its own threshold voltage, whereby transfer of electrical charges from the bit line pair BLS/A, /BLS/A to the bit line pair BLcell, /BLcell is terminated. At this point, the potential difference ΔVBLS/A of the bit line pair BLS/A, /BLS/A is amplified by the charge transfer gate 11 to a value obtained by the following equation (2) explained in THE BACKGROUND OF THE INVENTION.

$$\Delta VBLS/A = \Delta VBLcell \times Cb/Csa \quad (2)$$

where ΔVBLS/A is a potential change of the bit line BLS/A, ΔVBLcell is a potential change of the bit line BLcell, Cb is a capacitance of a bit line BLcell; and Csa is a capacitance of a bit line BLS/A.

Period 6

An operation during the period t6 is the same as in a conventional DRAM. More specifically, a potential difference αVBLS/A between the bit line pair BLS/A, /BLS/A on the sense amplifier side is amplified by the sense amplifier 10. Therefore, a potential of the bit line BLS/A becomes equal to the power supply voltage Vcc and a potential of the bit line /BLS/A becomes equal to a ground potential Vss. At this point, since a potential equal to or more than Vcc+Vth (e.g., 1.6V) is supplied as Vφt from the gate potential generator 12, the charge transfer gate 11 is turned on. Therefore, it is possible to transfer the potential of the bit line pair BLS/A, /BLS/A to the bit line pair BLcell, /BLcell by way of the charge transfer gate 11 while the potential is not reduced by the threshold value. As a result, data based on the potential of the bit line pair BLcell, /BLcell is rewritten to the memory cell. After the data rewrite is completed, the word line WL is turned off.

According to the first embodiment, a single precharging/equalizing circuit (consisting of 3 transistor) 13 is provided between the bit line pair BLS/A, /BLS/A located on the side of the charge transfer gate 11 near the sense amplifier 10. By controlling the precharging/equalizing circuit 13 and the charge transfer gate 11, the charge transfer type sense amplifier operated in accordance with the ½ Vcc precharge system can be attained. As a result, it is possible to decrease a circuit scale compared to a conventional case, so that a chip size can be reduced.

In the charge transfer gate 11 used in the first embodiment, it is possible to use an array selection gate applicable to the so-called shared sense amplifier system in which a sense amplifier is shared with two cell arrays without any modification.

Incidentally, in the first embodiment, two levels of potentials, ½ Vcc and Vcc[1+γ], must be generated by the bit line potential generator 14. Therefore, the circuit arrangement is inevitably complicated compared to the circuit in which only ½ Vcc usually used in the DRAM is generated. In addition, the gate potential generator 12 is required to generate three levels of potentials, βVth, Vss, Vcc+Vth. Therefore, the circuit arrangement is more complicated than that usually used in the DRAM in which two voltages Vpp and Vss are generated. However, the bit line potential generator 14 is arranged at a ratio of one to a plurality of precharging/equalizing circuits 13 and the gate potential generator 12 is arranged at a ratio of one to a plurality of charge transfer gates 11. Therefore, the circuit arrangement of this embodiment does not have a significant effect upon a chip size.

Figure 7:
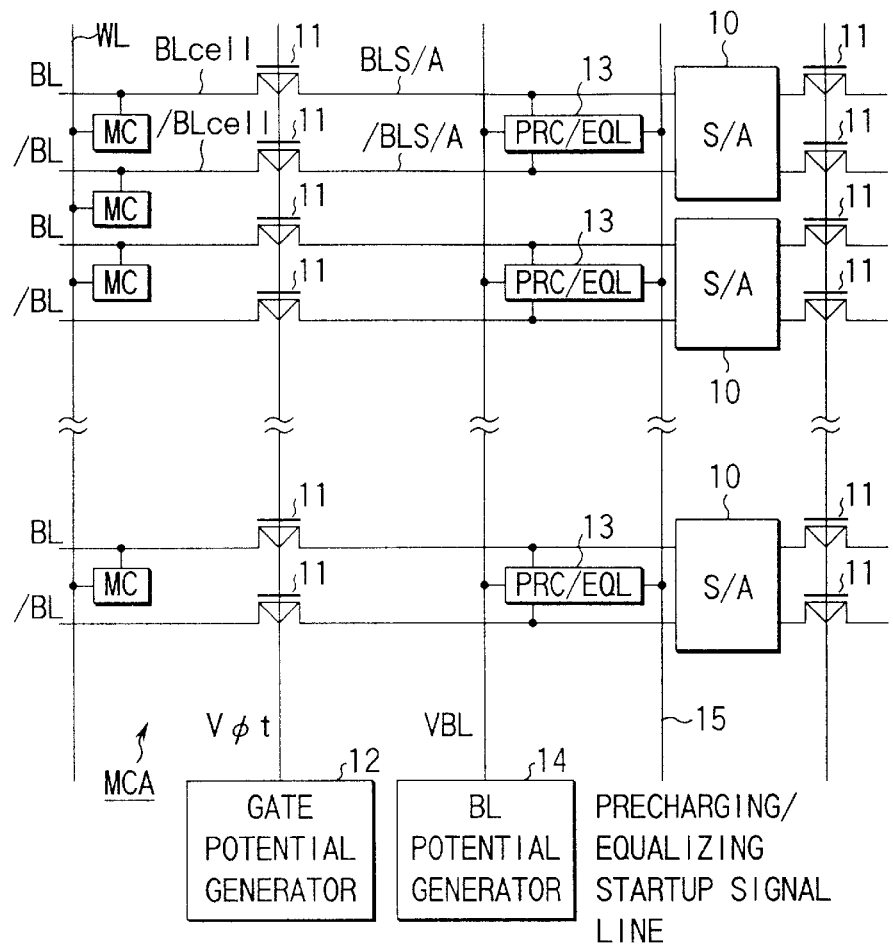
FIG. 7 shows a circuit arrangement of a modified example of the first embodiment, having a transfer gate formed of a p-channel MIS transistor arranged therein.
Figure 8:
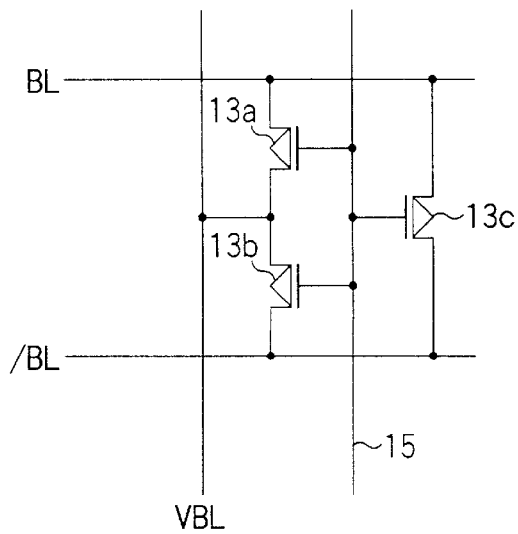
FIG. 8 is a circuit diagram in which the precharging/equalizing circuit shown in FIG. 5 is formed of p channel MIS transistors.

In the first embodiment, an n-channel MIS transistor is used as the charge transfer gate 11. However, a p-channel MIS transistor may be used. FIG. 7 is a circuit arrangement in which the p-channel type MIS transistor is used. The precharging/equalizing circuit 13 shown in FIG. 5 may be used as it is if gate and back gate voltages are appropriately set. However, the circuit 13 may be constituted of the p-type channel MIS transistor, as shown in FIG. 8.

In the case where the p-channel type MIS transistor is used as the charge transfer gate, a threshold Vth takes a negative value (e.g., −0.4V). In this case, a value β indicated by Equation (3) in the above is expressed by Equation (4) below.

$$\tfrac{1}{2}Vcc \times [1+Cs/(Cb+Cs)] > \beta > (Vzz \times Csa + \tfrac{1}{2}Vcc \times Cb)/(Cb+Csa+Cs) \quad (4)$$

where Cs is a capacitance of a memory cell, Cb is a capacitance of a bit line on the memory cell side, and Csa is a capacitance of a bit line on a sense amplifier side. Vzz is set so as to satisfy Equation (4).

Whether the n-channel MIS transistor or the p-channel MIS transistor is used as the charge transfer gate is determined based on which is more effective in reducing the chip size depending upon the well arrangement. More specifically, if the n-channel type MIS transistors serving as a sense amplifier is adjoined to the charge transfer gate and a well of the sense amplifier can be shared with the charge transfer gate, it may be useful to use the n-type MIS transistor requiring no additional well isolation region, in consideration of the chip size. On the other hand, if the p-channel type MIS transistors of the sense amplifier and the charge transfer gate can share a common well, the p-channel type MIS transistor is better to be used.

FIGS. 9A–9C are timing charts in the case where the p-channel MIS transistor is used as the charge transfer gate. Vφt is set at a value lower than Vss+Vth in Period t1. Furthermore, in the sense amplifier shown in FIGS. 6A–6C, the n-channel transistors are operated first. However, in the sense amplifier shown in FIGS. 9A–9C, the p-channel type transistors are operated first. It is preferable that the p-channel type transistor be used as the charge transfer gate, since a voltage between the source and drain of the p-channel type sense amplifier is increased, with the result that an operational margin is widened. However, if the operational margin is sufficiently provided, the initiation order for operations in the sense amplifier is not always the same as shown in FIGS. 9A–9C.

Second Embodiment

Now, a second embodiment of the present invention will be explained. FIGS. 10A–10C show timing charts of a semiconductor memory device according to the second embodiment. The second embodiment is the same as in the first embodiment except that the potential Vφt in Period 1 is changed. The circuit arrangement is the same as that of the first embodiment shown in FIG. 4.

In Period t1 of the first embodiment, the bit line potential generator 14 outputs a potential ½ Vcc. Using the potential ½ Vcc, the bit line pair BLS/A, /BLS/A are charged and equalized by each precharging/equalizing circuit 13. The gate generator 12 generates Vφt=½ Vcc+Vth to prevent a reduction of the transferred voltage due to the threshold voltage. However, as shown in FIGS. 10A–10C, when the bit line pair BLcell, /BLcell are precharged and equalized to ½ Vcc at Period t1, the potential output from the bit line potential generator 14 is not necessary to be ½ Vcc. More specifically, the output voltage Vφt from the gate potential generator 12 is ½ Vcc+Vth, it may be satisfactory if the potential VBL output from the bit line potential generator 14 is equal to or more than ½ Vcc. The potential VBL is set to be, for example, Vcc [1 +γ].

In the second embodiment, the gate potential generator 12 is required to generate four levels of potentials Vφt, such as ½ Vcc+Vth, Vss, β+Vth, and Vcc+Vth. However, the bit line potential generator 14 is not required to generate two potentials, ½ Vcc and Vcc [1+γ] but required to generate only Vcc [1+γ], unlike in the first embodiment. Since the bit line potential generator 14 has a large current capacity compared to the gate potential generator 12, a circuit arrangement of the bit line potential generator 14 can be simplified. Consequently, a chip size of the potential generator is significantly reduced.

In the second embodiment, a p-channel MIS transistor may be used as the charge transfer gate 11 instead of an n-channel MIS transistor. FIGS. 11A–11C show timing charts in the case where the p-channel MIS transistor is used. In this case, it is sufficient if the bit line potential generator 14 generates only Vzz.

Third Embodiment

Now, a third embodiment of the present invention will be explained. In the second embodiment, if an operation speed of, for example, the precharging section of the precharging/equalizing circuit 13 is faster than the equalizing section thereof, the bit line pair BLS/A, /BLS/A may be charged to a potential Vcc[1+γ] before the bit line pair BLcell, /BLcell are equalized. As a result, the case where the charge transfer gate 11 is turned off and thus the bit line pair BLcell, /BLcell are not sufficiently equalized may possibly take place.

To overcome this phenomenon, in the third embodiment, the precharging/equalizing circuit 13 is divided into a precharging circuit and an equalizing circuit and startup signals of the precharging circuit and the equalizing circuit are separately generated.

Figure 12:
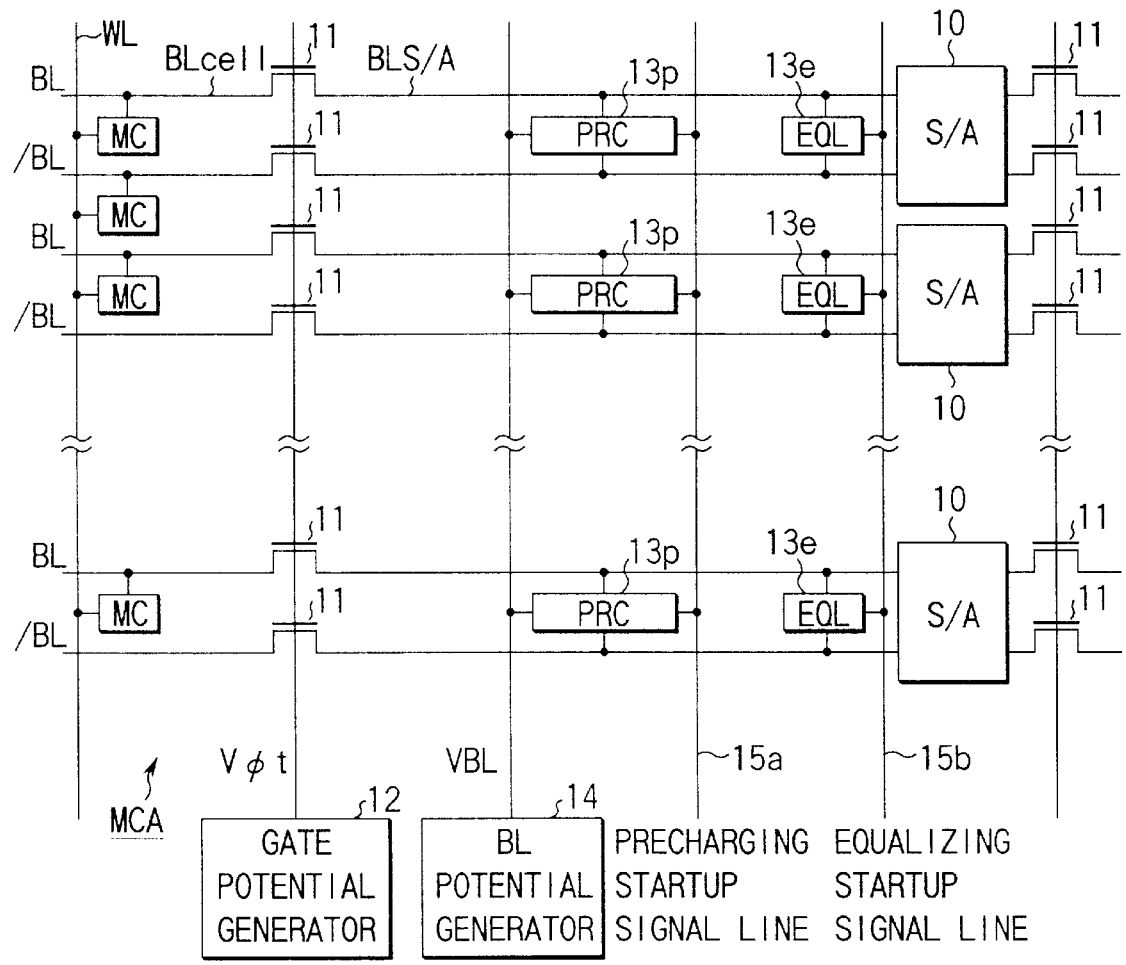
FIG. 12 is a circuit arrangement of a semiconductor memory device in which a charge transfer type sense amplifier according to a third embodiment of the present invention is used.

FIG. 12 shows a circuit arrangement of the third embodiment. In FIG. 12, like reference numerals are used to designate like structural elements corresponding to those in FIG. 4. In FIG. 12, a precharging circuit (PRC) 13p and an equalizing circuit (EQL) 13e are connected to the bit line pair BLS/A, /BLS/A. To the precharging circuit 13p, a precharging startup signal line 15a is connected. To the equalizing circuit 13e, an equalizing startup signal line 15b is connected. The precharging circuit 13p is the same as a circuit constituted of transistors 13a and 13b (see FIG. 5) according to the first embodiment. The equalizing circuit 13e is the same as a circuit constituted of the transistor 13c in FIG. 5.

In the aforementioned circuit arrangement, the bit line pair BLcell, /BLcell are first equalized by activating the equalizing startup signal line 15b and then the bit line pair BLS/A, /BLS/A are equalized by activating the precharge startup signal line 15a.

According to the third embodiment, the precharge circuit 13a and the equalizing circuit 13b are arranged in the bit line pair BLS/A, /BLS/A. The precharge circuit 13a and the equalizing circuit 13b are controlled by the signals from the precharging startup signal line 15a and the equalizing startup signal line 15b. With this arrangement, the bit line pair BLcell, /BLcell can be sufficiently equalized.

In addition, compared to the first embodiment, the number of the startup signal lines additionally added for controlling the precharging circuit 13p and the equalizing circuit 13e is only one in the third embodiment. Therefore, it is possible to prevent a chip from increasing in size.

Figure 13:
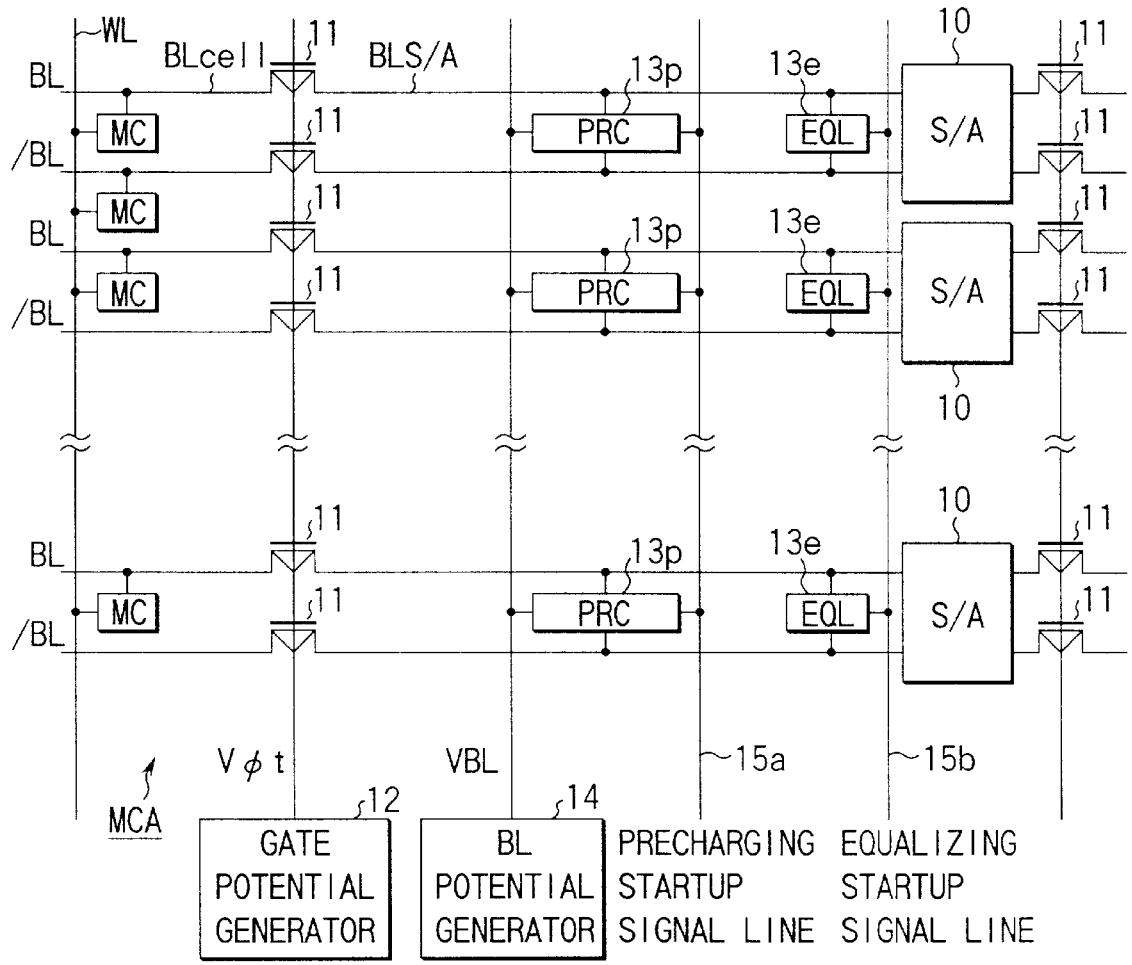
FIG. 13 is a circuit arrangement of a modified example of the third embodiment in which a transfer gate formed of a p-channel MIS transistor is used.

In the third embodiment, a p-channel MIS transistor may be used as the charge transfer gate 11 in place of an n-channel MIS transistor. FIG. 13 shows a circuit arrangement in the case where the p-channel MIS transistor is used.

Fourth Embodiment

Now, a fourth embodiment of the present invention will be explained. In the second and third embodiments, the bit line pair BLcell, /BLcell are equalized during Period t1. The output potential V$\phi$t of the gate potential generator 12 is set such that the charge transfer gate 11 is turned off due to its own threshold value after completion of the equalizing. Therefore, it is not necessary to decrease the potential V$\phi$t to the ground potential Vss during the period t2.

The fourth embodiment is directed to the case where the potential V$\phi$t is not reduced to the ground potential Vss. As the circuit arrangement, either FIG. 4 (or FIG. 7) or FIG. 12 (or FIG. 13) may be used.

FIGS. 14A–14C show operations in the case where data "1", for example, a power source voltage Vcc is stored in a memory cell on the side of the bit line BLcell. The gate potential generator 12 outputs a potential V$\phi$t=½ Vcc+Vth from Period t1 to the first half of Period t3 and outputs V$\phi$t=$\beta$+Vth during the latter half of Period t3.

Figures 15A, 15B, 15C:
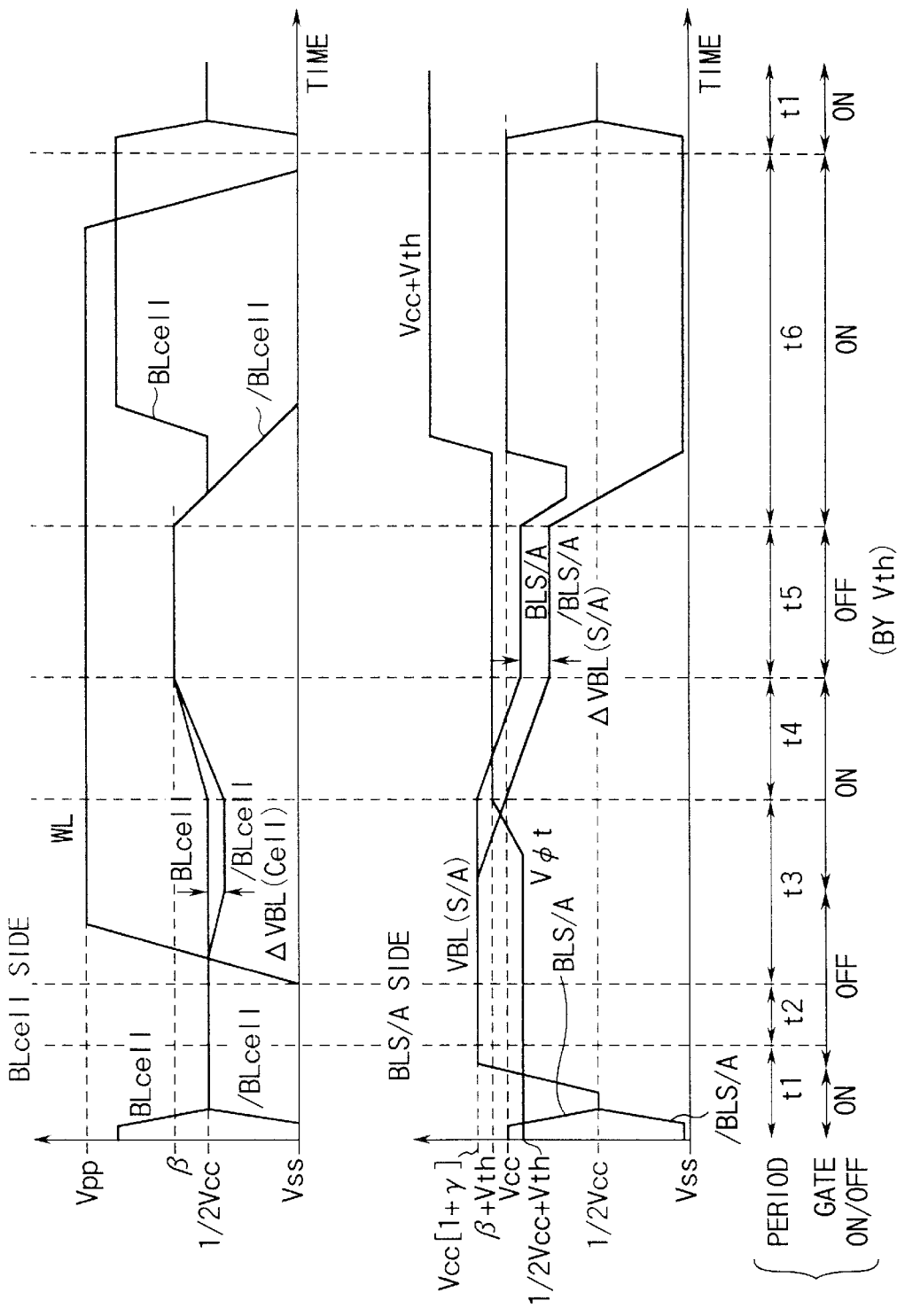
FIGS. 15A–15C are timing charts for explaining how to operate the semiconductor memory device according to the fourth embodiment of the present invention, when data "0" is stored in a memory cell.

FIGS. 15A–15C show operations in the case where data "0", for example, the ground voltage Vss is stored in a memory cell on the side of the bit line BLcell. Also in this case, the gate potential generator 12 outputs a potential V$\phi$t=½ Vcc+Vth from Period t1 to the first half of Period t3 and outputs V$\phi$t=$\beta$+Vth during the latter half of Period t3. In Period t3, when a word line W1 is activated and charge of the memory cell is released to the bit line /BLcell, the potential of the bit line /BLcell decreases. As a result, the charge transfer gate, which has been in an Off-state, is turned on, with the result that the potential of the bit line /BLS/A decreases. Under this state, it is possible to read out data by the sense amplifier 10. However, in the latter half of Period t3, the charge transfer gate is completely turned on by shifting the potential output from the gate potential generator 12 to V$\phi$t=$\beta$+Vth. Potentials of the bit line pair BLS/A, /BLS/A are decreased together by increasing a gate potential of the charge transfer gate to $\beta$+Vth. Consequently, a speed of the sense operation for data "0" can be increased.

According to the fourth embodiment, it is sufficient if the bit line potential generator 14 generates the potential Vcc [1+$\gamma$] and the gate potential generator 12 generates three potentials, ½ Vcc+Vth, $\beta$+Vth, Vcc+Vth. Therefore, the circuit arrangement can be simplified compared to the first to third embodiments, so that the chip can be prevented from increasing in size.

It is possible to reduce time required for on and off operations of the charge transfer gate. As a result, high-speed operation of the circuit and a reduction of current consumption can be realized.

Figures 16A, 16B, 16C:
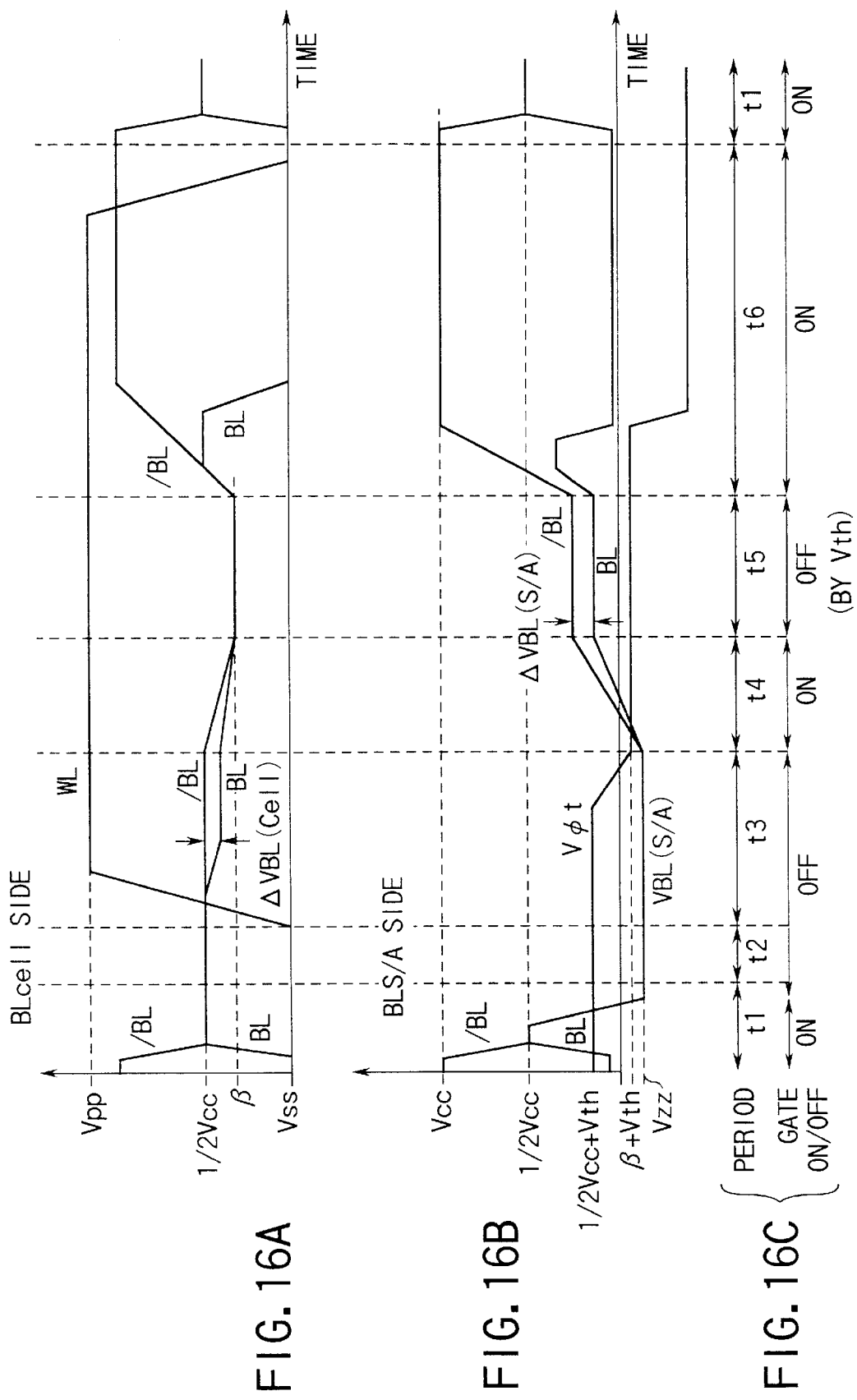
FIGS. 16A–16C are timing charts for explaining how to operate a semiconductor memory device according to a modified example of the fourth embodiment of the present invention having a transfer gate formed of a p-channel MIS transistor, when data "1" is stored in a memory cell.
Figures 17A, 17B, 17C:
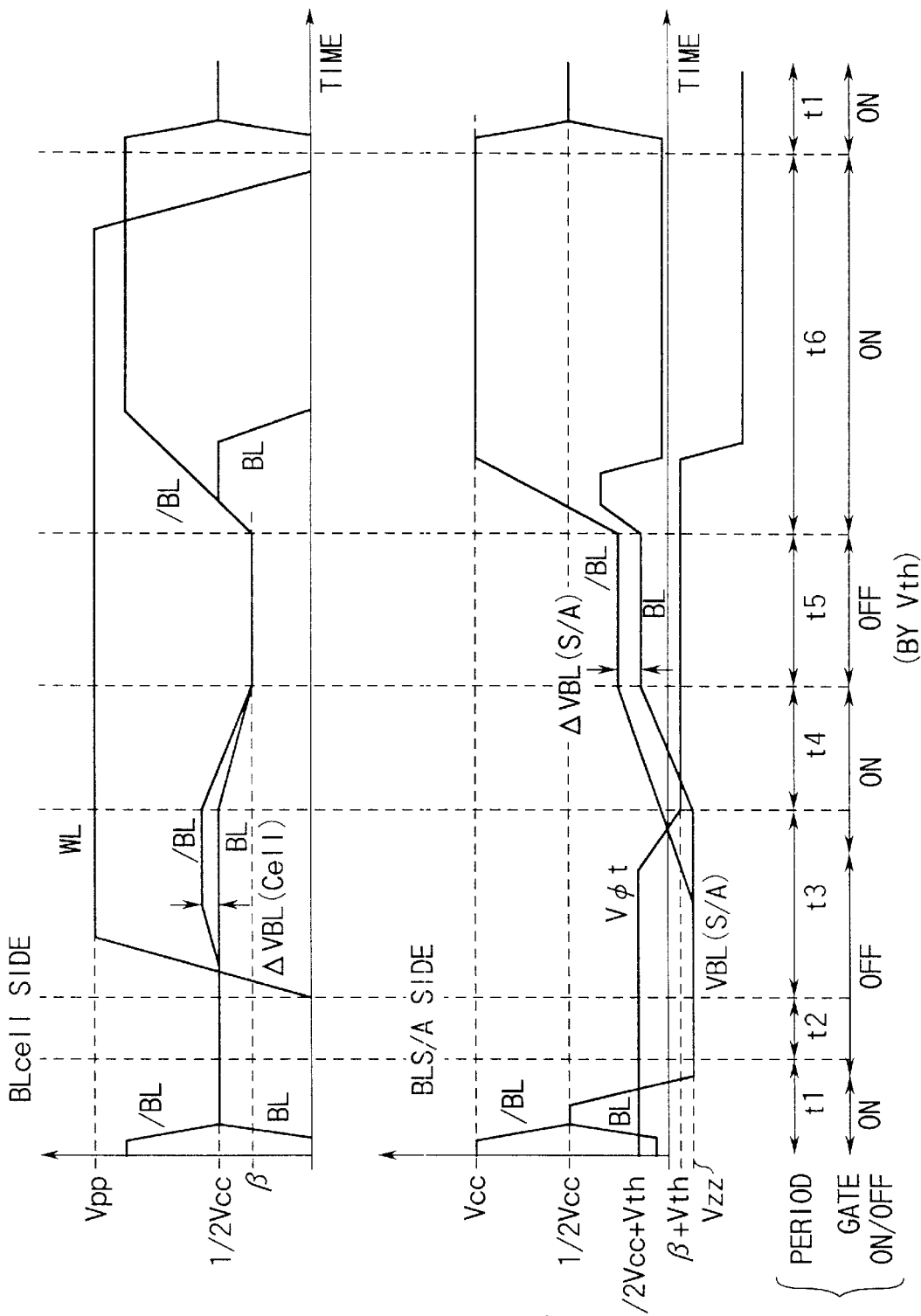
FIG. 17A–17C are timing charts for explaining how to operate a semiconductor memory device according to the modified example of the fourth embodiment of the present invention in which a transfer gate formed of a p-channel MIS transistor is used, when data "0" is stored in a memory cell.

Also, in the fourth embodiment, a p-channel MIS transistor may be used as the charge transfer gate 11 in place of an n-channel MIS transistor. FIGS. 16A–16C are timing charts in the case where the p-channel MIS transistor is used and data "0" is stored in a memory cell on the side of the bit line BLcell. FIGS. 17A–17C are timing charts in the case where the p-channel MIS transistor is used and data "1" is stored in a memory cell on the side of the bit line /BLcell. The bit line potential generator 14 generates a potential Vzz. The gate potential generator 12 generates three potentials, ½ Vcc+Vth, $\beta$+Vth, and Vss+Vth. Therefore, it is possible to prevent an increase of the chip size in the same way as in the n-channel MIS transistor.

Fifth Embodiment

Now, a fifth embodiment of the present invention will be explained. In the first to fourth embodiments, a potential V$\phi$t=$\beta$+Vth is generated from the gate potential generator 12 during Period t4. Therefore, a potential difference between a source potential ½ Vcc of the charge transfer gate 11 and the gate potential ($\beta$+Vth) is small, so that it is difficult to increase a speed of transferring charge from the bit line pair BLcell, /BLcell to the bit line pair BLS/A, /BLS/A. To increase the transfer speed, the potential V$\phi$t output from the gate potential generator 12 is set at $\beta$+Vth or more. As the circuit arrangement, either FIG. 4 (or FIG. 7) or FIG. 12 (or FIG. 13) can be used.

Figures 18A, 18B, 18C:
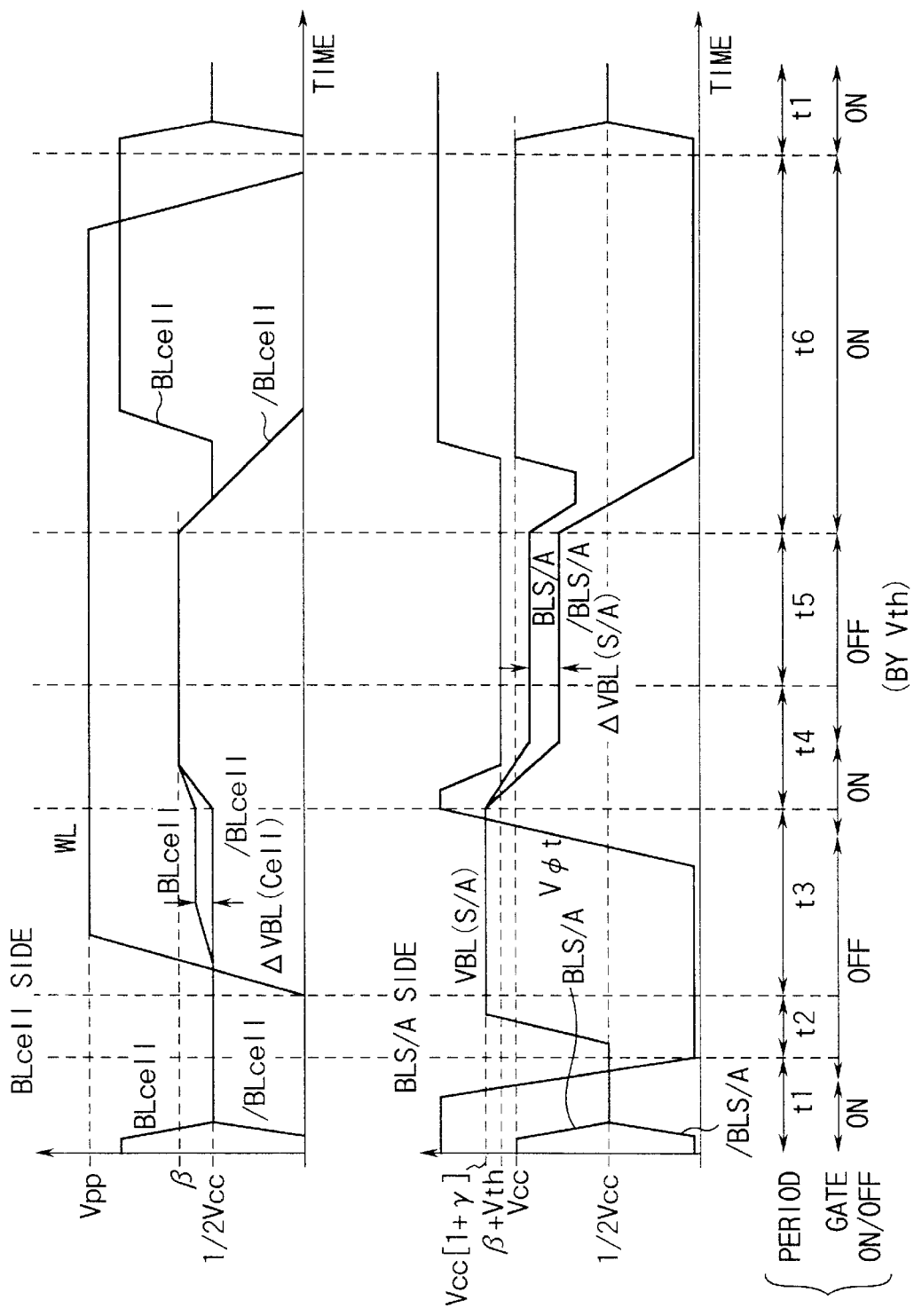
FIGS. 18A–18C are timing charts for explaining how to operate a semiconductor memory device according to a fifth embodiment of the present invention.

FIGS. 18A–18C show operations of a semiconductor memory device according to the fifth embodiment of the present invention. As shown in FIG. 18B, the potential V$\phi$t of $\beta$+Vth or more (the potential $\beta$+Vth or more is set at the highest level of V$\phi$t through the period t1, t4 and t6) is generated from the gate potential generator 12 in the first half of Period t4. The charge transfer gate 11 is started up by the potential of the highest level. Thereafter, the potential is shifted from the highest level to $\beta$+Vth in the latter half of Period t4.

According to the fifth embodiment, the gate of the charge transfer gate 11 is overdriven with the potential V$\phi$t of $\beta$+Vth or more at the time charge transfer is initiated. It is therefore possible to operate the semiconductor memory at a high speed. In addition, since the potential V$\phi$t is shifted back to $\beta$+Vth after the overdrive, the potential of the bit line pair BLcell, /BLcell increases up to $\beta$. Thus, the semiconductor memory of this embodiment is advantageous in that a high speed operation can be realized without changing the potential of the bit line pair BLS/A, /BLS/A from the value employed in the first embodiment.

Also, in the fifth embodiment, a p-channel MIS transistor may be used as the charge transfer gate 11 in place of an n-channel MIS transistor. FIGS. 19A–19C are timing charts in the case where the p-channel MIS transistor is used. In this case, at a startup of charge transfer, the gate of the charge transfer gate 11 is overdriven with the potential of β+Vth or less (Vss+Vth, for example, which is the lowest level of Vφt), so that a high speed operation can be realized.

As described in the foregoing, according to the present invention, a charge transfer type amplifier based on ½ Vcc precharge system can be realized by arranging the precharging/equalizing circuit of three transistors only on the bit line side near a sense amplifier as viewed from a transfer gate. Hence, it is possible to provide a semiconductor memory device without increasing the circuit scale.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a bit line pair including two complementary bit lines to each of which a memory cell is connected;
    a sense amplifier connected to the bit line pair, amplifying a potential difference of the bit line pair;
    charge transfer gates each inserted in and connected to a corresponding one of the two complementary bit lines of the bit line pair located between the memory cell and the sense amplifier, the charge transfer gates each having a control terminal controlling ON/OFF thereof;
    a gate potential generator connected to the charge control terminals, controlling ON/OFF of each of the charge transfer gates;
    a precharging/equalizing circuit connected to the bit line pair located on a sense amplifier side of the charge transfer gates; and
    a bit line potential generator connected to the precharging/equalizing circuit, generating a potential precharging and equalizing the bit line pair,
    wherein the gate potential generator controls each of the charge transfer gates such that a potential difference between the bit line pair located on a memory cell side is substantially zero just before the sense amplifier amplifies a potential difference between the bit line pair located on the memory cell side.

2. The semiconductor memory device according to claim 1, wherein the gate potential generator generates a potential of ½ Vcc+Vth or more (Vcc is a power supply voltage and Vth is a threshold voltage of the charge transfer gates) during a bit line precharging/equalizing period and the bit line potential generator generates a potential of ½ Vcc at the same time.

3. The semiconductor memory device according to claim 1, wherein the gate potential generator generates a potential of ½ Vcc+Vth or more (Vcc is a power supply voltage and Vth is a threshold voltage of the charge transfer gates) during a bit line precharging/equalizing period, and the bit line potential generator generates a potential of ½ Vcc or more after completion of equalization.

4. The semiconductor memory device according to claim 1, wherein the gate potential generator continuously activates the charge transfer gates until a potential of the memory cell is read out to a corresponding one of the bit lines to which the sense amplifier is connected.

5. The semiconductor memory device according to claim 1, wherein
    the gate potential generator supplies a potential to the control terminal of each of the charge transfer gates,
    the potential being higher than a value in a case where each of the charge transfer gates is an n-channel MIS transistor and lower in a case where each of the charge transfer gates is a p-channel MIS transistor,
    the value being obtained by adding a threshold voltage of the charge transfer gates to a potential which is to be transferred to a corresponding one of the two complementary bit lines on the sense amplifier side, after a potential of the memory cell is output to the corresponding one of the two complementary bit lines on a memory cell side,
    so that a potential of a corresponding one of the two complementary bit lines located on the memory cell side is transferred to the sense amplifier.

6. The semiconductor memory device according to claim 5, wherein the potential transferred to the bit line on the sense amplifier side is a highest one of potentials to be supplied by the gate potential generator in order to turn on the charge transfer gates in a case where each of the charge transfer gates is an n-channel MIS transistor, and a lowest one of the potentials in a case where each of the charge transfer gates is a p-channel MIS transistor.

7. The semiconductor memory device according to claim 1, wherein the gate potential generator outputs at least three levels of potentials.

8. The semiconductor memory device according to claim 1, wherein the gate potential generator outputs four levels of potentials and the bit line potential generator outputs a single potential.

9. The semiconductor memory device according to claim 1, wherein each of the charge transfer gates is not activated until a potential of the memory cell is output to a corresponding one of the two complementary bit lines, to which the memory cell is connected.

10. The semiconductor memory device according to claim 1, wherein each of the charge transfer gates is not activated by a threshold voltage thereof, after a potential of the memory cell is transferred to a corresponding one of the two complementary bit lines, to which the sense amplifier is connected.

11. A semiconductor memory device comprising:
    a bit line pair including two complementary bit lines to each of which a memory cell is connected;
    a sense amplifier connected to the bit line pair, amplifying a potential difference of the bit line pair;
    charge transfer gates each inserted in and connected to a corresponding one of the two complementary bit lines of the bit line pair located between the memory cell and the sense amplifier, the charge transfer gates each having a control terminal controlling ON/OFF thereof;
    a gate potential generator connected to the control terminals, controlling ON/OFF off of each of the charge transfer gates;
    a precharging circuit connected to the bit line pair of a sense amplifier side of the charge transfer gates, precharging the bit line pair;
    a first signal line connected to the precharge circuit, transmitting a precharge starter signal;
    an equalizing circuit connected to the bit line pair located on the sense amplifier side of the charge transfer gates, equalizing the bit line pair;

a second signal line connected to the equalizing circuit, transmitting an equalizing startup signal; and a bit line potential generator connected to the precharge circuit, generating a potential precharging the bit line pair, wherein the gate potential generator controls each of the charge transfer gates such that a potential difference between the bit line pair located on a memory cell side is substantially zero just before the sense amplifier amplifies a potential difference between the bit line pair located on the memory cell side.

12. The semiconductor memory device according to claim 11, wherein the gate potential generator generates a potential of ½ Vcc+Vth or more (Vcc is a power supply voltage and Vth is a threshold voltage of the charge transfer gate) during a bit line precharging/equalizing period and the bit line potential generator generates a potential of ½ Vcc at the same time.

13. The semiconductor memory device according to claim 11, wherein the gate potential generator generates a potential of ½ Vcc+Vth or more (Vcc is a power supply voltage and Vth is a threshold voltage of the charge transfer gate) during a bit line precharging/equalizing period, and the bit line potential generator generates a potential of ½ Vcc or more after completion of equalization.

14. The semiconductor memory device according to claim 11, wherein the gate potential generator continuously activates the charge transfer gates until a potential of the memory cell is output to a bit line to which the sense amplifier is connected.

15. The semiconductor device according to claim 11, wherein the gate potential generator supplies a potential to the control terminal of each of the charge transfer gates, said potential being higher than a value in a case where each of the charge transfer gates is an n-channel MIS transistor but lower in a case where each of the charge transfer gates is a p-channel MIS transistor, said value being obtained by adding a threshold potential of the charge transfer gates to a potential which is output to a corresponding one of the two complementary bit lines and transferred to the sense amplifier side when a potential of the memory cell is output to the corresponding one of the two complementary bit lines; and the gate potential generator transfers a potential of a corresponding one of the two complementary bit lines located on the memory cell side, to the sense amplifier.

16. The semiconductor memory device according to claim 15, wherein the potential transferred to the bit line on the sense amplifier side is a highest one of the potentials to be supplied by the gate potential generator in order to turn on and off each of the charge transfer gates in a case where each of the charge transfer gates is an n-channel MIS transistor and a lowest potential of said potentials in a case where each of the charge transfer gates is a p-channel MIS transistor.

17. The semiconductor memory device according to claim 11, wherein the gate potential generator outputs at least three levels of potentials.

18. The semiconductor memory device according to claim 11, wherein the gate potential generator outputs four levels of potentials and the bit line potential generator outputs a single potential.

19. The semiconductor memory device according to claim 11, wherein each of the charge transfer gates is not activated until a potential of the memory cell is output to a corresponding one of the two complementary bit lines, to which the memory cell is connected.

20. The semiconductor memory device according to claim 11, wherein each of the charge transfer gates is not activated by its own threshold voltage after a potential of memory cell is output to a corresponding one of the two complementary bit lines, to which the sense amplifier is connected.

21. A semiconductor memory device comprising:

a bit line pair including two complementary bit lines to each of which a memory cell is connected;

a sense amplifier connected to the bit line pair, amplifying a potential difference of the bit lien pair;

charge transfer gates each inserted in and connected to a corresponding one of the two complementary bit lines of the bit line pair located between the memory cell and the sense amplifier, the charge transfer gates each having a control terminal controlling ON/OFF thereof;

a gate potential generator connected to the charge control terminals, controlling ON/OFF of each of the charge transfer gates;

a precharging/equalizing circuit connected to the bit line pair located on a sense amplifier side of the charge transfer gates; and a bit line potential generator connected to the precharging/equalizing circuit, generating a potential precharging and equalizing the bit line pair, wherein the gate potential generator generates a potential of ½ Vcc+Vth or more (Vcc is a power supply voltage and Vth is a threshold voltage of the charge transfer gates) during a bit line precharging/equalizing period and the bit line potential generator generates a potential of ½ Vcc at the same time.

22. The semiconductor memory device according to claim 21, wherein the gate potential generator continuously activates the charge transfer gates until a potential of the memory cell is read out to a corresponding one of the bit lines to which the sense amplifier is connected.

23. The semiconductor memory device according to claim 21, wherein the gate potential generator supplies a potential to the control terminal of each of the charge transfer gates, the potential supplied to each control terminal being higher than a value in a case where each of the charge transfer gates is an n-channel MIS transistor and lower in a case where each of the charge transfer gates is a p-channel MIS transistor, the value being obtained by adding a threshold voltage of the charge transfer gates to a potential which is to be transferred to a corresponding one of the two complementary bit lines on the sense amplifier side, after a potential of the memory cell is output to the corresponding one of the two complementary bit lines on a memory cell side, so that a potential of a corresponding one of the two complementary bit lines located on the memory cell side is transferred to the sense amplifier.

24. The semiconductor memory device according to claim 23, wherein the potential transferred to the bit line on the sense amplifier side is a highest one of the potentials to be supplied by the gate potential generator in order to turn on the charge transfer gates in a case where each of the charge transfer gates is an n-channel MIS transistor, and a lowest one of the potentials in a case where each of the charge transfer gates is a p-channel MIS transistor.

25. The semiconductor memory device according to claim 21, wherein the gate potential generator outputs at least three levels of potentials.

26. The semiconductor memory device according to claim 21, wherein the gate potential generator outputs four levels of potentials and the bit line potential generator outputs a single potential.

27. The semiconductor memory device according to claim 21, wherein each of the charge transfer gates is not activated until a potential of the memory cell is output to a corresponding one of the two complementary bit lines, to which the memory cell is connected.

28. The semiconductor memory device according to claim 21, wherein each of the charge transfer gates is not activated by a threshold voltage thereof, after a potential of the memory cell is transferred to a corresponding one of the two complementary bit lines, to which the sense amplifier is connected.

29. A semiconductor memory device comprising:
a bit line pair including two complementary bit lines to each of which a memory cell is connected;
a sense amplifier connected to the bit line pair, amplifying a potential difference of the bit line pair;
charge transfer gates each inserted in and connected to a corresponding one of the two complementary bit lines of the bit line pair located between the memory cell and the sense amplifier, the charge transfer gates each having a control terminal controlling ON/OFF thereof;
a gate potential generator connected to the charge control terminals, controlling ON/OFF of each of the charge transfer gates;
a precharging/equalizing circuit connected to the bit line pair located on a sense amplifier side of the charge transfer gates; and
a bit line potential generator connected to the precharging/equalizing circuit, generating a potential precharging and equalizing the bit line pair,
wherein the gate potential generator generates a potential of ½ Vcc+Vth or more (Vcc is a power supply voltage and Vth is a threshold voltage of the charge transfer gates) during a bit line precharging/equalizing period, and the bit line potential generator generates a potential of ½ Vcc or more after completion of equalization.

30. The semiconductor memory device according to claim 29, wherein the gate potential generator continuously activates the charge transfer gates until a potential of the memory cell is read out to a corresponding one of the bit lines to which the sense amplifier is connected.

31. The semiconductor memory device according to claim 29, wherein the gate potential generator supplies a potential to the control terminal of each of the charge transfer gates,
the potential supplied to each control terminal being higher than a value in a case where each of the charge transfer gates is an n-channel MIS transistor and lower in a case where each of the charge transfer gates is a p-channel MIS transistor,
the value being obtained by adding a threshold voltage of the charge transfer gates to a potential which is to be transferred to a corresponding one of the two complementary bit lines on the sense amplifier side, after a potential of the memory cell is output to the corresponding one of the two complementary bit lines on a memory cell side,
so that a potential of a corresponding one of the two complementary bit lines located on the memory cell side is transferred to the sense amplifier.

32. The semiconductor memory device according to claim 31, wherein the potential transferred to the bit line on the sense amplifier side is a highest one of the potentials to be supplied by the gate potential generator in order to turn on the charge transfer gates in a case where each of the charge transfer gates is an n-channel MIS transistor, and a lowest one of the potentials in a case where each of the charge transfer gates is a p-channel MIS transistor.

33. The semiconductor memory device according to claim 29, wherein the gate potential generator outputs at least three levels of potentials.

34. The semiconductor memory device according to claim 29, wherein the gate potential generator outputs four levels of potentials and the bit line potential generator outputs a single potential.

35. The semiconductor memory device according to claim 29, wherein each of the charge transfer gates is not activated until a potential of the memory cell is output to a corresponding one of the two complementary bit lines, to which the memory cell is connected.

36. The semiconductor memory device according to claim 29, wherein each of the charge transfer gates is not activated by a threshold voltage thereof, after a potential of the memory cell is transferred to a corresponding one of the two complementary bit lines, to which the sense amplifier is connected.

37. A semiconductor memory device comprising:
a bit line pair including two complementary bit lines to each of which a memory cell is connected;
a sense amplifier connected to the bit line pair, amplifying a potential difference of the bit line pair,
charge transfer gates each inserted in and connected to a corresponding one of the two complementary bit lines of the bit line pair located between the memory cell and the sense amplifier, the charge transfer gates each having a control terminal controlling ON/OFF thereof;
a gate potential generator connected to the charge control terminals, controlling ON/OFF of each of the charge transfer gates;
a precharging/equalizing circuit connected to the bit line pair located on a sense amplifier side of the charge transfer gates; and
a bit line potential generator connected to the precharging/equalizing circuit, generating a potential precharging and equalizing the bit line pair,
wherein the gate potential generator supplies a potential to the control terminal of each of the charge transfer gates,
the potential supplied to each control terminal being higher than a value in a case where each of the charge transfer gates is an n-channel MIS transistor and lower in a case where each of the charge transfer gates is a p-channel MIS transistor,
the value being obtained by adding a threshold voltage of the charge transfer gates to a potential which is to be transferred to a corresponding one of the two complementary bit lines on the sense amplifier side, after a potential of the memory cell is output to the corresponding one of the two complementary bit lines on a memory cell side,
so that a potential of a corresponding one of the two complementary bit lines located on the memory cell side is transferred to the sense amplifier.

38. The semiconductor memory device according to claim 37, wherein the gate potential generator continuously activates the charge transfer gates until a potential of the memory cell is read out to a corresponding one of the bit lines to which the sense amplifier is connected.

39. The semiconductor memory device according to claim 37, wherein the potential transferred to the bit line on the sense amplifier side is a highest one of the potentials to be supplied by the gate potential generator in order to turn on the charge transfer gates in a case where each of the charge transfer gates is an n-channel MIS transistor, and a lowest one of the potentials in a case where each of the charge transfer gates is a p-channel MIS transistor.

40. The semiconductor memory device according to claim 37, wherein the gate potential generator outputs at least three levels of potentials.

41. The semiconductor memory device according to claim 37, wherein the gate potential generator outputs four levels of potentials and the bit line potential generator outputs a single potential.

42. The semiconductor memory device according to claim 37, wherein each of the charge transfer gates is not activated until a potential of the memory cell is output to a corresponding one of the two complementary bit lines, to which the memory cell is connected.

43. The semiconductor memory device according to claim 37, wherein each of the charge transfer gates is not activated by a threshold voltage thereof, after a potential of the memory cell is transferred to a corresponding one of the two complementary bit lines, to which the sense amplifier is connected.

44. A semiconductor memory device comprising:

a bit line pair including two complementary bit lines to each of which a memory cell is connected;

a sense amplifier connected to the bit line pair, amplifying a potential difference of the bit line pair;

charge transfer gates each inserted in and connected to a corresponding one of the two complementary bit lines of the bit line pair located between the memory cell and the sense amplifier, the charge transfer gates each having a control terminal controlling ON/OFF thereof;

a gate potential generator connected to the control terminals, controlling ON/OFF of each of the charge transfer gates;

a precharging circuit connected to the bit line pair of a sense amplifier side of the charge transfer gates, precharging the bit line pair;

a first signal line connected to the precharge circuit, transmitting a precharge startup signal;

an equalizing circuit connected to the bit line pair located on the sense amplifier side of the charge transfer gates, equalizing the bit line pair;

a second signal line connected to the equalizing circuit, transmitting an equalizing startup signal; and a bit line potential generator connected to the precharge circuit, generating a potential precharging the bit line pair, wherein the gate potential generator generates a potential of ½ Vcc+Vth or more (Vcc is a power supply voltage and Vth is a threshold voltage of each charge transfer gate) during a bit line precharging/equalizing period and the bit line potential generator generates a potential of ½ Vcc at the same time.

45. The semiconductor memory device according to claim 44, wherein the gate potential generator continuously activates each of the charge transfer gates until a potential of the memory cell is output to a bit line to which the sense amplifier is connected.

46. The semiconductor memory device according to claim 44, wherein the gate potential generator supplies a potential to the control terminal of each charge transfer gate, the potential being higher than a value in a case where each of the charge transfer gates is an n-channel MIS transistor but lower in a case where each of the charge transfer gates is a p-channel MIS transistor, the value being obtained by adding a threshold potential of the charge transfer gates to a potential which is output to a corresponding one of the two complementary bit lines and transferred to the sense amplifier side when a potential of the memory cell is output to the corresponding one of the two complementary bit lines; and the gate potential generator transfers a potential of a corresponding one of the two complementary bit lines located on the memory cell side, to the sense amplifier.

47. The semiconductor memory device according to claim 46, wherein the potential transferred to the bit line on the sense amplifier side is a highest one of the potentials to be supplied by the gate potential generator in order to turn on and off the charge transfer gates in a case where each of the charge transfer gates is an n-channel MIS transistor and a lowest one of the potentials in a case where each of the charge transfer gates is a p-channel MIS transistor.

48. The semiconductor memory device according to claim 44, wherein the gate potential generator outputs at least three levels of potentials.

49. The semiconductor memory device according to claim 44, wherein the gate potential generator outputs four levels of potentials and the bit line potential generator outputs a single potential.

50. The semiconductor memory device according to claim 44, wherein each of the charge transfer gates is not activated until a potential of the memory cell is output to a corresponding one of the two complementary bit lines, to which the memory cell is connected.

51. The semiconductor memory device according to claim 44, wherein each of the charge transfer gates is not activated by its own threshold voltage after a potential of the memory cell is output to a corresponding one of the two complementary bit lines, to which the sense amplifier is connected.

52. A semiconductor memory device comprising:

a bit line pair including two complementary bit lines to each of which a memory cell is connected;

a sense amplifier connected to the bit line pair, amplifying a potential difference of the bit line pair;

charge transfer gates each inserted in and connected to a corresponding one of the two complementary bit lines of the bit line pair located between the memory cell and the sense amplifier, the charge transfer gates each having a control terminal controlling ON/OFF thereof;

a gate potential generator connected to the control terminals, controlling ON/OFF of each of the charge transfer gates;

a precharging circuit connected to the bit line pair of a sense amplifier side of the charge transfer gates, precharging the bit line pair;

a first signal line connected to the precharge circuit, transmitting a precharge startup signal;

an equalizing circuit connected to the bit line pair located on the sense amplifier side of the charge transfer gates, equalizing the bit line pair;

a second signal line connected to the equalizing circuit, transmitting an equalizing startup signal; and a bit line potential generator connected to the precharge circuit, generating a potential precharging the bit line pair, wherein the gate potential generator generates a potential of ½ Vcc+Vth or more (Vcc is a power supply voltage and Vth is a threshold voltage of each charge transfer gate) during a bit line precharging/equalizing period, and the bit line potential generator generates a potential of ½ Vcc or more after completion of equalization.

53. The semiconductor memory device according to claim 52, wherein the gate potential generator continuously activates each of the charge transfer gates until a potential of the memory cell is output to a bit line to which the sense amplifier is connected.

54. The semiconductor memory device according to claim 52, wherein the gate potential generator supplies a potential to the control terminal of each charge transfer gate, the potential being higher than a value in a case where each of the charge transfer gates is an n-channel MIS transistor but lower in a case where each of the charge transfer gates is a p-channel MIS transistor, the value being obtained by adding a threshold potential of the charge transfer gates to a potential which is output to a corresponding one of the two complementary bit lines and transferred to the sense amplifier side when a potential of the memory cell is output to the corresponding one of the two complementary bit lines; and the gate potential generator transfers a potential of a corresponding one of the two complementary bit lines located on the memory cell side, to the sense amplifier.

55. The semiconductor memory device according to claim 54, wherein the potential transferred to the bit line on the sense amplifier side is a highest one of the potentials to be supplied by the gate potential generator in order to turn on and off each of the charge transfer gates in a case where each of the charge transfer gates is an n-channel MIS transistor and a lowest one of the potentials in a case where each of the charge transfer gates is a p-channel MIS transistor.

56. The semiconductor memory device according to claim 52, wherein the gate potential generator outputs at least three levels of potentials.

57. The semiconductor memory device according to claim 52, wherein the gate potential generator outputs four levels of potentials and the bit line potential generator outputs a single potential.

58. The semiconductor memory device according to claim 52, wherein each of the charge transfer gates is not activated until a potential of the memory cell is output to a corresponding one of the two complementary bit lines, to which the memory cell is connected.

59. The semiconductor memory device according to claim 52, wherein each of the charge transfer gates is not activated by its own threshold voltage after a potential of the memory cell is output to a corresponding one of the two complementary bit lines, to which the sense amplifier is connected.

60. A semiconductor memory device comprising:

a bit line pair including two complementary bit lines to each of which a memory cell is connected;

a sense amplifier connected to the bit line pair, amplifying a potential difference of the bit line pair;

charge transfer gates each inserted in and connected to a corresponding one of the two complementary bit lines of the bit line pair located between the memory cell and the sense amplifier, the charge transfer gates each having a control terminal controlling ON/OFF thereof;

a gate potential generator connected to the control terminals, controlling ON/OFF of each of the charge transfer gates;

a precharging circuit connected to the bit line pair of a sense amplifier side of the charge transfer gates, precharging the bit line pair;

a first signal line connected to the precharge circuit, transmitting a precharge startup signal;

an equalizing circuit connected to the bit line pair located on the sense amplifier side of the charge transfer gates, equalizing the bit line pair;

a second signal line connected to the equalizing circuit, transmitting an equalizing startup signal; and a bit line potential generator connected to the precharge circuit, generating a potential precharging the bit line pair, wherein the gate potential generator supplies a potential to the control terminal of each charge transfer gate, the potential being higher than a value in a case where each of the charge transfer gates is an n-channel MIS transistor but lower in a case where each of the charge transfer gates is a p-channel MIS transistor, the value being obtained by adding a threshold potential of the charge transfer gates to a potential which is output to a corresponding one of the two complementary bit lines and transferred to the sense amplifier side when a potential of the memory cell is output to the corresponding one of the two complementary bit lines, and the gate potential generator transfers a potential of a corresponding one of the two complementary bit lines located on the memory cell side, to the sense amplifier.

61. The semiconductor memory device according to claim 60, wherein the gate potential generator continuously activates each of the charge transfer gates until a potential of the memory cell is output to a bit line to which the sense amplifier is connected.

62. The semiconductor memory device according to claim 60, wherein the potential transferred to the bit line on the sense amplifier side is a highest one of the potentials to be supplied by the gate potential generator in order to turn on and off each of the charge transfer gates in a case where each of the charge transfer gates is an n-channel MIS transistor and a lowest one of the potentials in a case where each of the charge transfer gates is a p-channel MIS transistor.

63. The semiconductor memory device according to claim 60, wherein the gate potential generator outputs at least three levels of potentials.

64. The semiconductor memory device according to claim 60, wherein the gate potential generator outputs four levels of potentials and the bit line potential generator outputs a single potential.

65. The semiconductor memory device according to claim 60, wherein each of the charge transfer gates is not activated until a potential of the memory cell is output to a corresponding one of the two complementary bit lines, to which the memory cell is connected.

66. The semiconductor memory device according to claim 60, wherein each of the charge transfer gates is not activated by its own threshold voltage after a potential of the memory cell is output to a corresponding one of the two complementary bit lines, to which the sense amplifier is connected.

* * * * *

UNITED STATES PATENT AND TRADEMARK OFFICE
CERTIFICATE OF CORRECTION

PATENT NO.   : 6,154,402
DATED        : November 28, 2000
INVENTOR(S)  : Hironobu Akita It is certified that error appears in the above-identified patent and that said Letters Patent is hereby corrected as shown below:

Title page, left column,
Line 10, "Sep. 7, 1998" has been deleted and in its place -- Sep. 7, 1999 -- has been inserted.

Title page, right column,
In the "References Cited" section, under line 5, the following has been inserted:

-- OTHER DOCUMENTS

Masaki Tsukude, et al., "A 1.2V to 3.3V Wide-Voltage-Range DRAM with 0.8V Array Operation", ISSCC Digest of Technical Papers, Feb. 1997, pp. 66-67.

Lawrence G. Heller, et al., "High Sensitivity Charge-Transfer Sense Amplifier", IEEE Journal of Solid-State Circuit, Vol. SC-11, No. 5, October 1976, pp. 596-601. --

Signed and Sealed this

Twenty-fifth Day of September, 2001

*Attest:*

NICHOLAS P. GODICI
*Attesting Officer*   *Acting Director of the United States Patent and Trademark Office*